United States Patent
Nagasawa et al.

(10) Patent No.: US 12,381,071 B2
(45) Date of Patent: Aug. 5, 2025

(54) PLASMA PROCESSING METHOD AND PLASMA PROCESSING APPARATUS

(71) Applicant: Hitachi High-Tech Corporation, Tokyo (JP)

(72) Inventors: Mitsuru Nagasawa, Tokyo (JP); Soichiro Eto, Tokyo (JP); Tatehito Usui, Tokyo (JP); Shigeru Nakamoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/440,110

(22) PCT Filed: Sep. 17, 2020

(86) PCT No.: PCT/JP2020/035193
§ 371 (c)(1),
(2) Date: Sep. 16, 2021

(87) PCT Pub. No.: WO2022/059114
PCT Pub. Date: Mar. 24, 2022

(65) Prior Publication Data
US 2023/0215710 A1  Jul. 6, 2023

(51) Int. Cl.
*H01J 37/32* (2006.01)
*G01B 11/06* (2006.01)
(Continued)

(52) U.S. Cl.
CPC ........ *H01J 37/32972* (2013.01); *G01B 11/06* (2013.01); *H01J 37/32743* (2013.01);
(Continued)

(58) Field of Classification Search
CPC .......... H01J 37/32972; H01J 37/32743; H01J 2237/24578; H01J 2237/334; H01J 37/32;
(Continued)

(56) References Cited

U.S. PATENT DOCUMENTS

| 5,352,324 A | 10/1994 | Gotoh et al. |
| 5,807,761 A * | 9/1998 | Coronel .................. H01L 22/26 216/60 |

(Continued)

FOREIGN PATENT DOCUMENTS

| JP | 2000111313 A | 4/2000 |
| JP | 2003083720 A | 3/2003 |

(Continued)

OTHER PUBLICATIONS

Search Report mailed Nov. 10, 2020 in International Application No. PCT/JP2020/035193.

(Continued)

*Primary Examiner* — Duy Vu N Deo
*Assistant Examiner* — Christopher Remavege
(74) *Attorney, Agent, or Firm* — Miles & Stockbridge, P.C.

(57) ABSTRACT

A process of detecting a thickness of a film layer to be processed or a depth of etching by using a result of detection of a signal indicating intensity of interference light having a plurality of wavelengths formed by being reflected on a surface of a wafer at a plurality of time instants from when plasma is formed to when the etching is completed. A start time instant is detected by using an amount of change in the intensity of the interference light. Then, a remaining film thickness or the etching amount at an arbitrary time instant is detected from a result of comparing actual data indicating the intensity of the interference light at the arbitrary time instant during the processing after the start time instant with a plurality of pieces of data for detection of the intensity of the interference light obtained in advance and associated with values of the film thicknesses or the depths of etching.

7 Claims, 15 Drawing Sheets

(51) Int. Cl.
  *H01L 21/3213* (2006.01)
  *H01L 21/66* (2006.01)
(52) U.S. Cl.
  CPC ........ *H01L 21/32136* (2013.01); *H01L 22/26* (2013.01); *H01J 2237/24578* (2013.01); *H01J 2237/334* (2013.01)
(58) Field of Classification Search
  CPC ........... H01J 37/32926; H01J 37/32935; H01J 37/32963; G01B 11/06; G01B 11/0683; H01L 21/32136; H01L 22/26; H01L 21/67253; H01L 22/12; H01L 21/3065; H01L 21/67069
  See application file for complete search history.

(56) References Cited

U.S. PATENT DOCUMENTS

| | | | |
|---|---|---|---|
| 6,589,869 B2 * | 7/2003 | Sarfaty ................... | H01L 22/26 438/689 |
| 6,650,426 B1 * | 11/2003 | Zalicki .............. | H01J 37/32963 356/626 |
| 9,228,828 B2 * | 1/2016 | Goto ................... | G01B 11/0675 |
| 9,530,666 B2 | 12/2016 | Mizuno et al. | |
| 9,934,946 B2 * | 4/2018 | Kawaguchi ....... | H01L 22/26 |
| 9,972,546 B2 * | 5/2018 | Li ........................... | H01L 22/26 |
| 10,665,516 B2 | 5/2020 | Matsui et al. | |
| 2004/0040658 A1 * | 3/2004 | Usui ................. | H01J 37/32935 257/E21.252 |
| 2004/0165193 A1 * | 8/2004 | Ohmoto ............. | G01B 11/0625 356/504 |
| 2005/0029228 A1 * | 2/2005 | Nozawa ............. | G01B 11/0675 216/60 |
| 2005/0194095 A1 * | 9/2005 | Usui ................. | H01J 37/32972 156/345.28 |
| 2007/0202613 A1 * | 8/2007 | Usui ................. | G01B 11/0625 438/14 |
| 2008/0216956 A1 * | 9/2008 | Nakamoto ......... | G01B 11/0625 156/345.25 |
| 2011/0139748 A1 | 6/2011 | Donnelly et al. | |
| 2013/0023125 A1 | 1/2013 | Singh | |
| 2014/0295583 A1 * | 10/2014 | Nakamoto ........ | H01J 37/32972 156/345.25 |
| 2015/0021294 A1 * | 1/2015 | Togami ............. | H01J 37/32458 216/60 |
| 2015/0235861 A1 | 8/2015 | Mizuno et al. | |
| 2016/0284610 A1 * | 9/2016 | Usui ....................... | H01L 22/20 |
| 2016/0351403 A1 * | 12/2016 | Grimbergen ........ | H01L 21/3085 |
| 2016/0351405 A1 * | 12/2016 | Fukuchi ............ | H01J 37/32009 |
| 2016/0379841 A1 | 12/2016 | Hidaka et al. | |
| 2017/0178874 A1 * | 6/2017 | Kawaguchi ....... | H01J 37/32935 |
| 2018/0269118 A1 | 9/2018 | Matsui et al. | |
| 2018/0277377 A1 * | 9/2018 | Eto ................... | H01J 37/32009 |
| 2018/0286643 A1 * | 10/2018 | Tuitje .................... | G01N 21/31 |

FOREIGN PATENT DOCUMENTS

| | | |
|---|---|---|
| JP | 2003243368 A | 8/2003 |
| JP | 2005294348 A | 10/2005 |
| JP | 2007234666 A | 9/2007 |
| JP | 2009117685 A | 5/2009 |
| JP | 2012529777 A | 11/2012 |
| JP | 2014072264 A | 4/2014 |
| JP | 201711167 A | 1/2017 |
| JP | 2017112238 A | 6/2017 |
| KR | 1020170000791 A | 1/2017 |
| TW | 201841247 A | 11/2018 |
| WO | 2014046083 A1 | 3/2014 |

OTHER PUBLICATIONS

Written Opinion mailed Nov. 10, 2020 in International Application No. PCT/JP2020/035193.
Office Action mailed Apr. 20, 2022 in Taiwanese Application No. 11134541.
Office Action dated Mar. 17, 2020 in Japanese Application No. 2017-052066.
Office Action mailed Oct. 5, 2018 in Taiwanese Application No. 106125570.
Office Action mailed Aug. 18, 2018 in Korean Application No. 10-2017-0091300.
Notice of Allowance mailed Apr. 22, 2020 in U.S. Appl. No. 15/690,660.
Office Action mailed Aug. 2, 2019 in U.S. Appl. No. 15/690,660.
Office Action mailed Nov. 16, 2018 in U.S. Appl. No. 15/690,660.
Office Action mailed Dec. 31, 2024 in Chinese Application No. 202080020834.2.

* cited by examiner

PLASMA PROCESSING METHOD AND PLASMA PROCESSING APPARATUS

TECHNICAL FIELD

The present invention relates to a plasma processing apparatus or a plasma processing method.

BACKGROUND ART

In manufacturing a semiconductor device, various components, wires that interconnect the components, and the like are formed on a surface of a wafer. These components and wires can be formed by repeatedly forming films of various materials such as conductors, semiconductors, and insulators and removing unnecessary portions.

Dry etching (hereinafter, referred to as plasma etching) using plasma is widely used as a process of removing unnecessary portions. In the plasma etching, a gas introduced into a processing chamber of an etching apparatus is turned into plasma by a radio frequency power supply or the like, and a wafer is exposed to the gas turned into plasma to perform etching processing. At this time, anisotropic or isotropic etching is performed by sputtering by ions in plasma, a chemical reaction by radicals, or the like, and by selectively using the etching, components and wires having various structures are formed on the surface of the wafer.

In a case where a processed shape obtained by such etching processing is different from a designed shape, the manufactured semiconductor cannot exhibit desired performance. Therefore, a process monitoring technique for monitoring and stabilizing the etching processing is required in order to bring the processed shape close to the designed shape.

In particular, as semiconductor devices have been miniaturized in recent years, miniaturization processes have increased, and as a result, a method of forming a pattern of a semiconductor device has been diversified. Therefore, there is an increasing need to monitor changes in a film thickness and depth from immediately after a start of etching.

Meanwhile, for example, there is a technique related to a process monitor that measures a film thickness of a film formed on a wafer or a depth of a groove or a hole formed on the wafer by measuring reflected light from the wafer being processed. The process monitor is called a film thickness and depth monitor, and has been used for determining an end point of etching processing.

An example of an etching monitoring technique is disclosed in PTL 1. PTL 1 discloses a technique of measuring uniformity of an etching rate of a film to be etched in a surface to be etched by continuously monitoring from a change start point A to a change end point B of a light emission waveform of a desired wavelength detected from plasma during dry etching processing in a process of performing plasma dry etching processing on a conductor film deposited on a wafer using a photoresist pattern formed on the conductor film as an etching mask, and obtaining an optimum value of an etching amount of the film to be etched on the basis of the uniformity.

Further, PTL 2 discloses a plasma processing apparatus including a detector that detects interference light of multiple wavelengths from a surface of a sample during etching processing, a pattern comparator that compares actual deviation pattern data on the interference light obtained at an arbitrary time instant during processing of the sample and a plurality of standard deviation patterns corresponding to a plurality of thicknesses of the film, and calculates a deviation, the standard deviation patterns corresponding to interference light data of multiple wavelengths obtained, before the processing of the sample, for processing another sample, a deviation comparator that compares the deviation between the data and a predetermined deviation and outputs data on a thickness of the film of the sample at that time, a remaining film thickness time-series data recorder that records, as time series data, the data on the thickness of the film, and an end point determiner that determines whether a predetermined amount of etching is completed using the data on the thickness of the film.

CITATION LIST

Patent Literature

PTL 1: JP 2003-243368 A
PTL 2: JP 2007-234666 A

SUMMARY OF INVENTION

Technical Problem

In the above known technique, the following problem has occurred.

First, in the technique disclosed in PTL 1, in order the to improve reliability of the etching processing, uniformity of the etching rate of an etching film is measured by continuously detecting a voltage from the change start point A to the change end point B of the emission waveform of a predetermined wavelength detected from the plasma during the etching processing. The optimum value of the etching amount is determined on the basis of the obtained etching rate.

However, in the technique disclosed PTL 1, the voltage of a desired wavelength with high sensitivity is assumed to uniformly increase or decrease and change monotonously, but things that increase or decrease during processing, such as a light amount of plasma emission during actual etching, are not considered. Thus, it may be difficult to accurately detect the film thickness.

Furthermore, in the technique disclosed in PTL 2, it is possible to compare a pattern of the interference light obtained from the surface of the wafer at an arbitrary time instant during the processing with a pattern in a database using the database of patterns of the interference light of a plurality of wavelengths obtained in advance, record a value of a film thickness corresponding to data having the smallest deviation as film thickness information in time series, calculate an etching amount (depth, remaining film thickness, and speed) and the like at an arbitrary time instant from the time-series data of the film thickness, and determine whether an end point of the etching processing is reached.

However, in the technique disclosed in PTL 2, the etching amount is detected on the premise that the etching processing progresses at a speed equal to or higher than a predetermined value immediately after plasma is formed in the etching processing and light emission is started, and the remaining film thickness uniformly decreases and changes.

Therefore, in a case where the etching processing does not uniformly progress, for example, in a case where the processing does not easily progress in a predetermined initial period after the start of light emission of plasma, the accuracy of detecting the film thickness may be greatly impaired.

As described above, under the condition that the remaining film thickness and a parameter of detection of the etching amount such as an amount of light emission and a speed of the progress of the processing vary during a period in which the processing is performed including an initial stage of the processing immediately after the start of the light emission of the plasma, the conventional technique has a difficulty in solving the problem that the accuracy of the detection of the etching amount is impaired and a processing yield is lowered.

An object of the invention is to provide a plasma processing apparatus or a plasma processing method in which an etching amount of a film to be processed is detected with high accuracy and a processing yield is improved.

Solution to Problem

In order to solve the above problems, one representative plasma processing method according to embodiments is a method of arranging a wafer having a layer to be processed on a surface thereof in a processing chamber inside a vacuum container, forming plasma in the processing chamber, and etching a film formed in advance on a surface of the wafer, receiving interference light reflected on a surface of the wafer at a plurality of time instants from when the plasma is formed to when the etching is completed, determining an etching start time instant of the wafer based on data indicating amounts of change per a time period between two of the plurality of time instants in signals, the signals indicating an intensity of the interference light corresponding to each of the plurality of time instants after the plasma is formed and the layer to be processed is exposed to the plasma; detecting a film thickness or determining reaching an end point of the processing of the wafer using a signal indicating the intensity of the interference light obtained at the plurality of time instants after the determined etching start time, and controlling the etching of the wafer in accordance with the determined etching start time and the detected film thickness or the determined end point of the processing. The signal indicating the intensity of the interference light includes a spectral waveform, and the etching start time instant is determined by calculating differences between the spectral waveforms at the two of the plurality time instants, and a time instant when a sum of the differences per the time period between the two of the plurality time instants becomes equal to or more than a predetermined threshold value is determined as the etching start time instant.

Further, one representative plasma processing apparatus according to embodiments is a plasma processing apparatus that arranges a wafer having a layer to be processed on a surface thereof in a processing chamber inside a vacuum container, forms plasma in the processing chamber, and etches a film formed in advance on a surface of the wafer, and the plasma processing apparatus is achieved by including a detector configured to receive interference light reflected on the surface of the wafer and generate a signal indicating intensity of the interference light at a plurality of time instants from when the plasma is formed to when the etching is completed, a determiner configured to determine an etching start time instant based on data indicating amounts of change per a time period between two of the plurality of time instants in signals, the signals indicating the intensities of the interference light corresponding to each of the plurality of time instants after the plasma is formed and the layer to be processed is exposed to the plasma, and to detect the film thickness or determine reaching an end point of the processing of the wafer using the signal indicating the intensity of the interference light obtained at the plurality of time instants after the determined etching start time. The signal indicating the intensity of the interference light includes a spectral waveform, and the determiner is configured to calculate differences between the spectral waveforms at the two of the plurality time instants, and determine as the etching start time instant a time instant when a sum of the differences per the time period between the two of the plurality time instants becomes equal to or more than a predetermined threshold value.

Advantageous Effects of Invention

The invention can provide a plasma processing apparatus or a plasma processing method in which an etching amount of a film to be processed is detected with high accuracy and a processing yield is improved.

Details of a configuration, operation, and effect of the invention will be clarified by the following description of embodiments.

DESCRIPTION OF EMBODIMENTS

Hereinafter, an embodiment of the invention will be described with reference to FIGS. 1 to 15.

Figure 1:
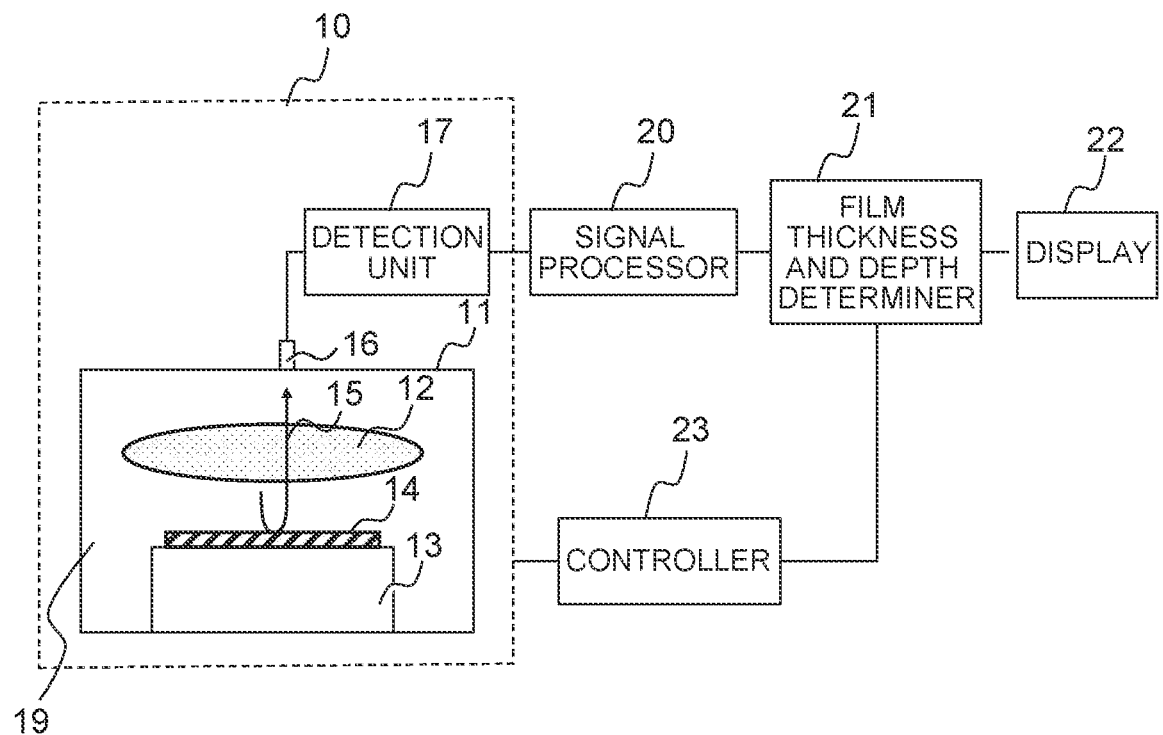
FIG. 1 is a schematic longitudinal sectional view of a general configuration of a plasma processing apparatus according to an embodiment of the invention.

FIG. 1 is a schematic longitudinal sectional view of a general configuration of a plasma processing apparatus according to the embodiment of the invention. A plasma processing apparatus 10 illustrated in this drawing includes a vacuum container 11 having a cylindrical shape at least in part and a processing chamber 19 provided with plasma 12 in an inner space disposed inside the vacuum container 11 and decompressed.

A processing gas for etching introduced from a gas introduction unit (not illustrated) is introduced into the processing chamber 19, and a magnetic field is formed by a generator of a radio frequency electric field of predetermined frequency band, a microwave electric field, or a magnetic field such as a solenoid coil by power supplied from a radio frequency power source (not illustrated) or the like. Atoms or molecules of the processing gas are excited by an interaction between the electric fields or between the electric fields and the magnetic field, and ionized and dissociated to form the plasma 12.

In the processing chamber 19, in a state where the plasma 12 is formed, a semiconductor wafer (hereinafter, referred to as a wafer) 14 as a sample to be processed disposed and held on an upper surface of a sample stage 13 in the processing chamber 19 comes into contact with charged particles such as particles and ions having high reactivity and activity in the plasma 12, a physical and chemical action between these particles and a material of a surface of a film layer to be processed disposed in advance on a surface of the wafer 14 is generated, and etching progresses.

In this embodiment, operations of components of the plasma processing apparatus 10 are performed by a controller 23 connected to the components to be able to communicate data with a wired cable or wirelessly. Such operations include introduction of gas into the processing chamber 19, formation of an electric field or a magnetic field, generation and disappearance of the plasma 12 due to the formation of the electric field or the magnetic field, adjustment of intensity and distribution of the plasma 12, and supply and stop of radio frequency power for forming a bias potential above the wafer 14, the radio frequency power being disposed in the sample stage 13 and supplied during the formation of the plasma 12.

The controller 23 according to this embodiment has an interface through which the above communication is inputted and outputted, a calculator such as a microprocessor by a semiconductor device, and a storage such as a RAM or a ROM, a hard disk drive, or a DVD-ROM drive in which data or software is recorded, and includes a configuration in which these components are communicably connected. The controller 23 can adjust timing of the operation including an amount of operation of each component and synchronization of start, end, and the like of the operation such that a desired etching processing is achieved on the film layer to be processed on the wafer 14 in the processing chamber 19. Further, the controller 23 stores a program that performs control illustrated in a flowchart in FIG. 7 to be described later, and performs control of the plasma processing apparatus 10 in accordance with the program.

During the etching processing, the wafer 14 is irradiated with light generated by the plasma 12 formed in the processing chamber 19. The emitted light is reflected by a film structure constituting a circuit of a semiconductor device formed in advance on the surface of the wafer 14 prior to the processing, and is reflected by a plurality of surfaces such as an outermost surface of the film structure or an interface between two films stacked vertically and a bottom surface inside a pattern of the circuit. Then, the emitted and reflected light becomes interference light 15 in which interference occurs due to a difference in a length of a path of the light.

The interference light 15 is received by a light receiver 16 including a window made of a material having translucency, such as quartz, attached to a wall surface of the vacuum container 11 through a window member made of a material having translucency and facing inside of the processing chamber 19, and a lens disposed above the window. Further, the interference light 15 is transmitted to a detection unit 17 connected via a light transmission path such as an optical fiber optically connected to the light receiver 16, the detection unit 17 being connected to the light transmission path. The detection unit 17 has a spectroscope that divides light having a wavelength in a predetermined band for each light having a wavelength at a predetermined wavelength interval, and the interference light 15 dispersed by the detection unit 17 at an arbitrary time instant during processing is detected as a spectrum of the interference light 15 indicating a light amount of the interference light for each wavelength at the arbitrary time instant. The light receiver 16 and the detection unit 17 constitute a detector.

In this embodiment, the spectrum of the interference light 15 is detected every predetermined time interval (time) during the processing of the wafer 14. A signal at each sampling time instant is transmitted from the detection unit 17 as a time-series signal indicating the spectrum of the interference light 15.

The signal indicating the spectrum of the interference light 15 at an arbitrary time instant detected by the detection unit 17 is transmitted to a signal processor 20, and is converted into a signal or processed in the signal processor 20 such that the etching amount and an end point can be detected more accurately. Specifically, the signal inputted to the signal processor 20 is subjected to processing such as light amount offset processing and radio frequency noise removal processing.

The signal subjected to such processing is transmitted to a film thickness and depth determiner (determiner) 21, and a value of a film thickness or depth at an arbitrary time instant is detected from the transmitted signal. In this embodiment, from the signal corresponding to each time instant, an etching amount at this time instant may be detected. Furthermore, the etching amount at this time instant with higher accuracy may be detected using the etching amount at this time instant and an etching amount detected at a time instant during the processing before this time instant.

A signal indicating a value of the detected etching amount is transmitted to a display 22 and displayed or notified. Further, upon determination that a target etching amount or a remaining film thickness has been reached in this processing from a result detected by the film thickness and depth determiner 21, the controller 23 transmits a command signal to the plasma processing apparatus 10, stops the supply of the processing gas or the formation of plasma, and completes the etching processing of the wafer 14.

It goes without saying that the plasma processing apparatus 10 is not limited to the configuration illustrated in FIG. 1. Here, the plasma processing apparatus 10 may include the signal processor 20, the film thickness and depth determiner, the controller 23, and the like, which are illustrated as external devices.

Figure 2:
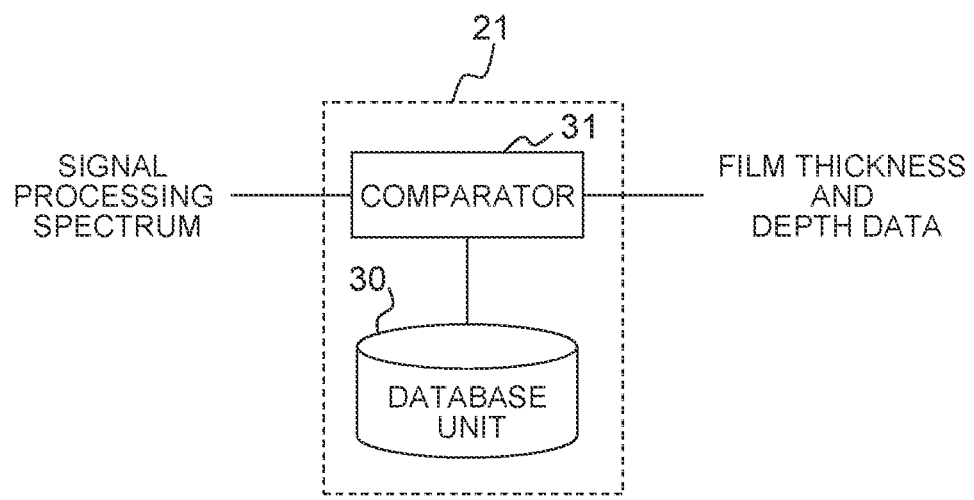
FIG. 2 is a schematic block diagram of a configuration of a film thickness and depth determiner of the plasma processing apparatus according to the embodiment illustrated in FIG. 1.

FIG. 2 is a schematic block diagram of a configuration of the film thickness and depth determiner of the plasma processing apparatus according to the embodiment illustrated in FIG. 1. The drawing schematically shows the configuration of the film thickness and depth determiner 21 to which each block exhibiting each function is connected.

As illustrated in this drawing, a signal indicating the spectrum of the interference light 15 at an arbitrary time instant processed by the signal processor 20 to have an appropriate signal shape is transmitted to the film thickness and depth determiner 21, and data of the signal is compared with data obtained in advance in a comparator 31. The data to be compared is recorded and stored in advance in a storage of the database unit 30 communicably connected to the comparator 31.

In the storage of the database unit 30, for example, a film thickness obtained when a film structure identical to a film structure for a circuit for the semiconductor device manufactured by processing the wafer 14 using the plasma processing apparatus 10 or a film structure having a dimension and type similar to be regarded as identical is processed under conditions that are identical to the processing conditions of the wafer 14 or so similar to be regarded as identical is recorded in association with the time-series data of the spectrum having a plurality of predetermined wavelengths of the interference light 15

Such data may be data detected when another wafer (referred to as a wafer for test) having a film structure equivalent to a film structure of the wafer 14 is processed in advance under equivalent processing conditions, or may be data of a result of calculation such as simulation. In this embodiment, from the data obtained in advance as described above, the values of the plurality of etching amounts such as the remaining film thickness during processing are associated with a plurality of patterns of changes in the light amount of the spectrum of the interference light 15 or a differential value thereof with respect to the change in wavelength, or with a plurality of patterns of the light amount of the interference light 15 or the differential value thereof with the wavelength as a parameter, and the data is recorded in the storage of the database unit 30.

For example, the film thickness of a processing target before the start of the processing of the wafer for text and the film thickness after the processing are measured, each value of the film thickness (a plurality of etching amounts) that changes in accordance with the progress of etching in the same processing target is associated with the spectrum of the interference light 15 using a value of the film thickness and the data recorded in the database unit 30, and the data of a time-series pattern is stored in the database unit 30 together with the associated information. Data indicating the associated relationship between the film thickness and the feature data of the spectrum of the interference light is referred to as film thickness and spectrum data. The feature data of the spectrum refers to information representing the spectrum, such as a spectral waveform, an intensity corresponding to a wavelength, and a change in a differential value. In a case where the differential value is used, an influence of spike noise or the like included in an original signal can be suppressed, and an S/N ratio is improved.

By comparing the film thickness and spectrum data in the database unit 30 with the spectrum of the interference light at an arbitrary time instant actually obtained by being processed by the signal processor 20 during the etching processing of the wafer 14, the value of the etching amount corresponding to the pattern of a light amount determined to be closest to the actual data is detected as the etching amount (remaining film thickness or depth) of the wafer 14 at the arbitrary time instant.

The method of determining the film thickness and depth is not limited to the above. For example, in a case where the film thickness and spectrum data of the database unit 30 is small, interpolation may be performed on the basis of a plurality of spectra in the film thickness and spectrum data to generate a new spectrum, and the film thickness may be set to a value corresponding to the new spectrum to increase the film thickness and spectrum data. Further, a plurality of wafers for text to be measured may be prepared in advance, and the film thickness and spectrum data may be set for each of a plurality of conditions. In addition, during mass production, the film thickness and spectrum data may be added to the database unit 30 using a film thickness inspection result before and after the etching processing of the wafer 14, and the film thickness and spectrum data to be compared may be increased.

Furthermore, in the film thickness and depth determiner 21, the comparator 31 may include one or more semiconductor devices or circuits thereof, or may be a partial circuit inside one semiconductor device. The database unit 30 may include a storage such as a RAM, a ROM, a hard disk drive, or a DVD-ROM drive, and an interface that is connected to the storage and the comparator 31 so as to be able to communicate with each other by wire or wirelessly and can transmit and receive data. The database unit 30 may be attached to the plasma processing apparatus 10 together with the comparator 31 or may be disposed at a remote place.

Comparative Example

FIGS. 3 and 4 are schematic graphs of a change in the film thickness and a change in an error of the detected film thickness with respect to a lapse of time during the etching processing according to a comparative example.

Figure 3A:
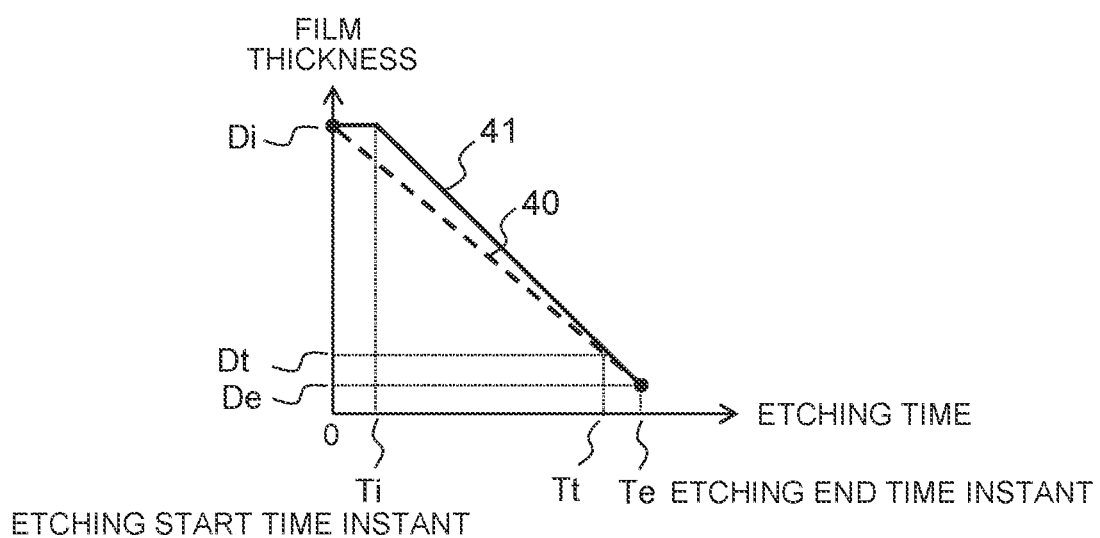
FIGS. 3A to 3B are schematic graphs of a change in a film thickness and a change in an error of a detected film thickness with respect to a lapse of time during etching processing according to a comparative example.
Figure 3B:
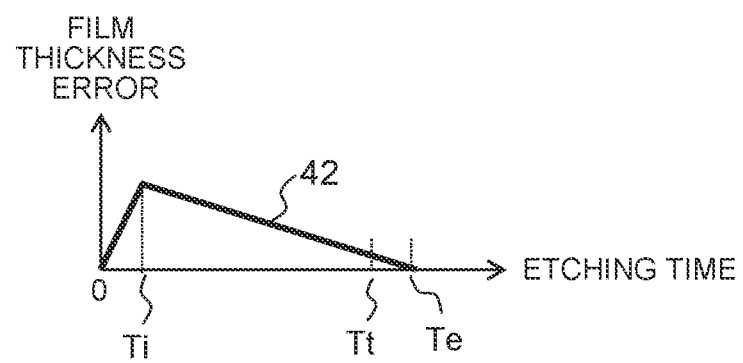

FIG. 3A is a graph illustrating a relationship between the remaining film thickness of the film layer to be processed that is detected during the etching processing according to the comparative example and the actual remaining film thickness. FIG. 3B is a graph illustrating a change in a difference (film thickness error) between the remaining film thickness detected during the etching and the actual remaining film thickness illustrated in FIG. 3A. In these drawings, a horizontal axis represents an etching time, a start time instant of the etching processing is 0, an end time instant of the etching processing is Te, a value of the remaining film thickness before the start of the processing is Di, and a value of the remaining film thickness after the end of the processing is De.

Here, a process of obtaining data of intensity (spectrum) having the wavelength of the interference light 15 as a parameter is performed by processing in advance the wafer 14 for text having a film structure equivalent to a film structure of the wafer 14 for semiconductor device manufacturing under processing conditions equivalent to conditions during the processing for semiconductor device manufacturing or by simulating the wafer 14 for text on calculation.

In this process, a time point at which the plasma 12 is formed in the processing chamber 19 or the radio frequency power is supplied to an electrode for bias potential formation disposed in the sample stage 13 is regarded as a processing start time instant, the interference light 15 from the surface of the wafer 14 is detected at each sampling time instant after the start time instant, and the remaining film thickness at the time instant is calculated. Further, together with the value of the remaining film thickness at the time instant of the calculation, the value of the remaining film thickness at the sampling time instant during the processing before the time instant is used, and the value of the remaining film thickness at the time instant is finally calculated. At this time, for calculation of a final remaining film thickness at each sampling time instant, a method of recursive analysis using a value of the remaining film thickness at a time instant before at least one of the time instants is used.

Furthermore, in the comparative example, in the calculation of the remaining film thickness during the etching processing of the wafer 14 performed up to the end point of the processing for manufacturing the semiconductor device using the feature data of the spectrum of the interference light at each time instant during the processing obtained in advance, the time instant when the film layer to be processed starts to be etched is regarded as the time instant when the plasma is formed or the radio frequency power for bias potential formation starts to be supplied. However, in practice, in an initial stage of the processing immediately after the time instant when the plasma 12 is formed and the radio frequency power starts to be supplied to the electrode in the sample stage 13, the intensity and distribution of the plasma 12 and a magnitude and distribution of the bias potential are not stabilized, and a speed (rate) of the processing or the time point when the processing substantially starts to progress varies for each wafer 14 or for each process if the processing is configured by a plurality of processes.

That is, during the actual etching processing of the wafer 14, the etching and the progress of the etching are not stably performed immediately after the plasma 12 is formed and light emission is started. Specifically, in the value of the actual remaining film thickness indicated by a solid line 41 in FIG. 3A, as a value of a film thickness D is shown to be substantially constant near a vertical axis, it takes a predetermined time (time from a time instant 0 to Ti in this example) in accordance with a film type and the processing conditions until a state is stabilized and the progress of etching is stabilized after the plasma 12 is formed, and the etching of the film layer to be processed substantially does not progress during this period. Therefore, the actual start time instant of etching is shifted by Ti.

However, in the comparative example, as the value of the remaining film thickness at the time point regarded as the start of the processing, the remaining film thickness of a processing target before the start is regarded as being stably and uniformly reduced from the value Di to the remaining film thickness De when it is determined that the end point of the processing has been reached, and the remaining film thickness at an arbitrary time instant during the processing is recursively calculated using the value of the remaining film thickness at a time instant before the time instant. Therefore, the value of the remaining film thickness D at each time instant detected in the comparative example is obtained by interpolating a value at a time instant before each time instant during a period of the processing from a time instant 0 to a time instant Te as schematically indicated by a broken line 40 in FIG. 3A as a straight line passing through the thickness De at the time instant 0 (on the vertical axis).

As a result, in the comparative example, as shown in FIG. 3B, a deviation (film thickness error) occurs between the detected value of the remaining film thickness and the actual value of the remaining film thickness, and this is largest at a predetermined time instant (time instant Ti) immediately after the formation of the plasma 12 or the start of supply of the radio frequency power for bias potential formation to the sample stage 13.

In FIGS. 3A to 3B, the value of the remaining film thickness at the time instant (end time instant) when it is determined that the etching processing has reached the end point coincides with De. However, in the processing of the wafer 14 for test for inputting and outputting the data stored in the database unit 30, the values of parameters of the structure such as the film thickness, shape, and dimension of each layer such as a base layer and a mask layer of the film structure are generally set deeper than the end point of the actual process in order to set the data of the database unit 30 over a wider range than the values of parameters of the actual wafer 14. Thus, when the etching processing is terminated at a time instant Tt at which a remaining film thickness Dt as a target of the end point is detected, the remaining film thickness does not coincide with Dt, and an error occurs. As a result, as indicated by a solid line 42 in FIG. 3B, there occurs an error in the remaining film thickness detected with the etching start time instant Ti as a peak, and there also occurs a film thickness error at the estimated time Tt at which the etching processing is completed. However, because the film thickness error tends to appear smaller as the etching time is longer, the film thickness error is small in long-time etching.

Figure 4A:
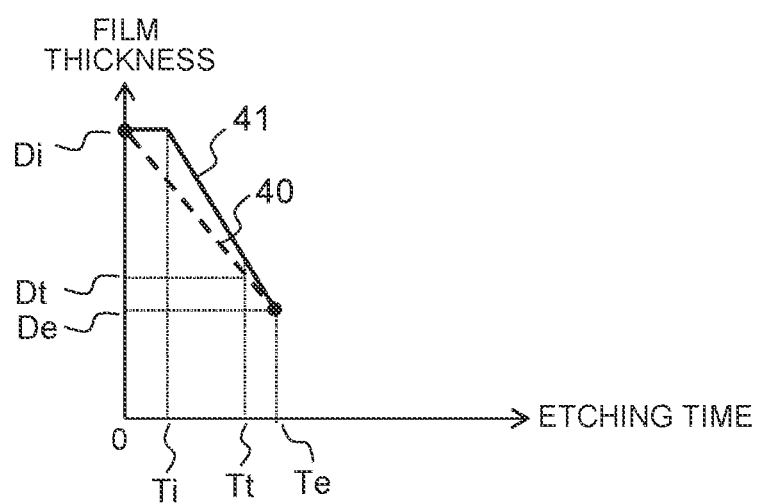
FIGS. 4A to 4B are schematic graphs of a change in the film thickness and a change in an error of the detected film thickness with respect to a lapse of time during the etching processing according to the comparative example.
Figure 4B:
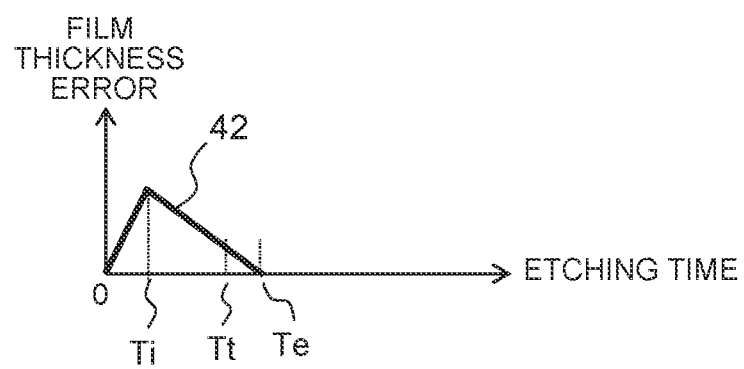

However, as the time from the start to the end of the etching processing becomes shorter, this influence cannot be ignored. FIG. 4A is a graph illustrating a relationship between a film thickness estimation of the comparative example and the actual film thickness with respect to the etching time at the time of creating database in short-time etching. FIG. 4B is a graph illustrating the film thickness error of the comparative example in the long-time etching. The reference signs are the same as the reference signs in FIGS. 3A to 3B, and thus the description thereof will be omitted. In the short-time etching, the influence of the shift of the etching start time instant Ti becomes relatively large, there arises a problem that the error of the remaining film thickness at the time instant Tt when the processing is completed with the target remaining film thickness Dt becomes large as illustrated in FIG. 4B.

Figure 5A:
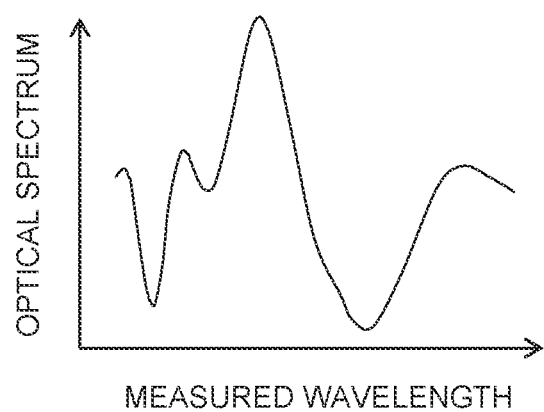
FIGS. 5A to 5B are graphs illustrating an example of a spectrum of interference light obtained before and after a time instant at which the plasma processing apparatus according to the embodiment illustrated in FIG. 1 starts the etching processing of a wafer.
Figure 5B:
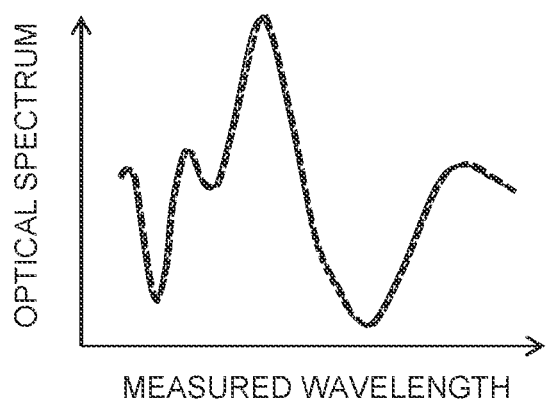

FIGS. 5A to 5B are graphs illustrating an example of the spectrum of the interference light obtained before and after a time instant at which the plasma processing apparatus according to the embodiment illustrated in FIG. 1 starts the etching processing of a wafer. FIG. 5A illustrates a result of superimposing spectra obtained by plotting the values of intensity of the interference light 15 at each sampling time instant from the time instant when the plasma 12 is formed in the processing chamber 19 to the time instant Ti when etching of the film layer to be processed is started for each of the plurality of predetermined wavelengths (frequencies) with the wavelength (frequency) on a of horizontal axis. FIG. 5B illustrates a result superimposing the spectra of the interference light 15 obtained at each sampling time instant after the time instant Ti.

As illustrated in FIG. 5A, the spectrum of the interference light 15 hardly changes until the time instant Ti. On the other hand, as illustrated in FIG. 5B, the spectra of the interference light 15 obtained at each sampling time instant after the time instant Ti have clearly different values at the same wavelength, and it can be seen that there is a difference in a vertical direction between lines on which the values are plotted and that the spectrum changes.

Information of the intensity of the light indicated by the spectrum of the interference light 15 indicates the remaining film thickness of the film layer constituting the film structure constituting a circuit pattern arranged on the surface of the wafer 14. It is therefore determined that a state of the plasma 12 is stabilized and the etching of the film layer to be processed has progressed to a predetermined threshold value or more after the time instant Ti, and it can be regarded that the etching is started at the time instant Ti.

In this way, it is determined whether there is a change amount equal to or larger than a predetermined threshold value between the spectra of the interference light 15 at each sampling time instant or the waveforms of the spectra, and the sampling time instant at which the change is determined to be equal to or larger than the threshold value is regarded as the start time instant of the etching processing, and then the start time instant of the etching processing can be determined.

Figure 6:
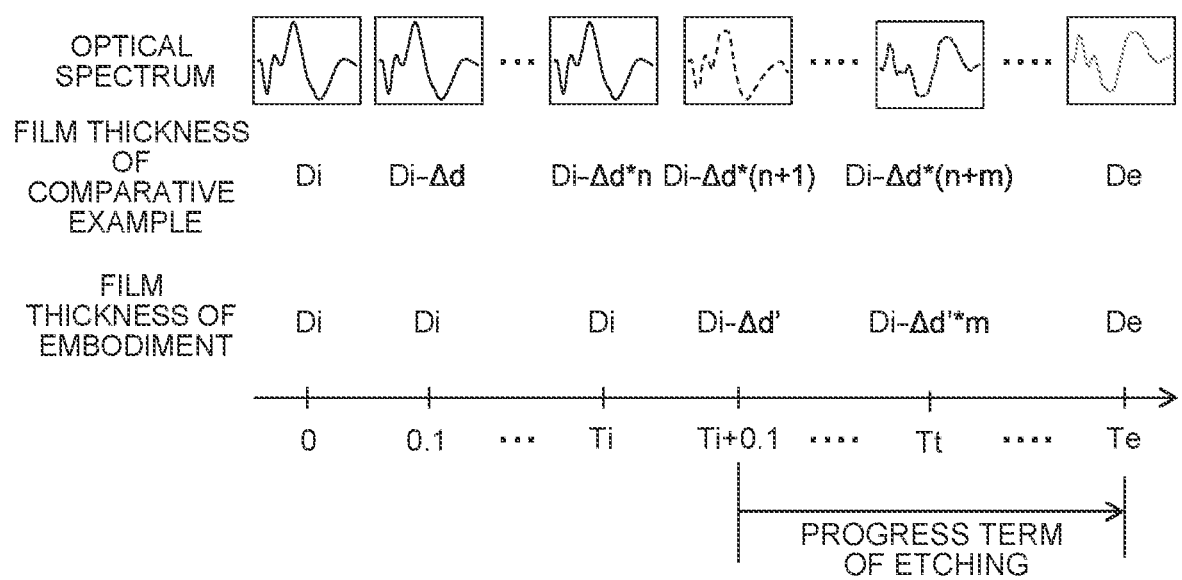
FIG. 6 is a diagram illustrating a correspondence between data of the database unit of the plasma processing apparatus according to the embodiment illustrated in FIG. 1 and a remaining film thickness detected from the data.

FIG. 6 is a diagram illustrating a correspondence between data of the database unit of the plasma processing apparatus according to the embodiment illustrated in FIG. 1 and the remaining film thickness detected from the data. In particular, in FIG. 6, the feature data of the spectrum of the interference light 15 obtained at an arbitrary time instant after the start of the processing is compared in the comparator 31 of the film thickness and depth determiner 21 with reference to the film thickness and spectrum data stored in the database unit 30, and the film thickness corresponding to the spectrum in which the difference is determined to be smallest is compared between the comparative example and the embodiment.

FIG. 6 illustrates a spectrum of the interference light 15 from the wafer 14 obtained when a film to be processed on the wafer 14 for test having a configuration equivalent to the configuration of the wafer 14 subjected to the etching processing for manufacturing the semiconductor device is disposed in the processing chamber 19 and subjected to the etching processing, or obtained by calculating the etching processing by simulation or the like.

In the data in FIG. 6, the time instant at which the etching processing is started and the plasma 12 is formed in the processing chamber 19, or the time instant at which the bias potential at which the radio frequency power is supplied to the electrode in the sample stage 13 to attract charged particles such as ions in the plasma 12 to the wafer 14 is formed or assumed by calculation to be formed is set as the time instant 0 of the period of the process.

In FIG. 6, a waveform obtained by plotting the spectrum of the interference light 15 at the time instant 0 of the period of the process and each sampling time instant after the time instant 0 and represented as a graph, and the value of the remaining film thickness detected as a value corresponding to each time instant by the plasma processing apparatus according to the comparative example and the plasma processing apparatus 10 according to this embodiment are illustrated in association with the time instant during the period of the process taken on the horizontal axis.

In this embodiment, an interval (sampling interval) between the sampling time instants is set to 0.1 seconds (sec). Further, the thickness of the film to be processed before the start of the etching processing is Di, and the target remaining film thickness to be the end point of the etching processing is De.

As illustrated in FIG. 6, in the data in this embodiment, the waveform of the graph indicating the spectrum obtained from the interference light 15 is so equivalent to be regarded as having no change from the time instant 0 to Ti, and the waveform varies at the sampling time instant (Ti+0.1 seconds) immediately after the time instant Ti.

That is, in this embodiment, it is determined that a difference amount (difference) between the change in the value of the predetermined wavelength (frequency) or a spectral waveform of the spectrum obtained at the sampling time instant after the time instant 0 and a spectral waveform at an arbitrary sampling time instant (previous sampling time instant in this embodiment) before the time instant is smaller than a predetermined threshold value, and it is determined that the etching of the film to be processed is not in progress and is unprocessed. As a result, the remaining film thickness from the time instant 0 to the time instant Ti is detected as the same value as the value Di before the etching processing, and the period from the time instant 0 to the time instant Ti is regarded as a period in which the film to be processed is unprocessed.

As a result of detection of the amount of change in the spectrum value or waveform equal to or more than the predetermined threshold value at the time instant (Ti+0.1) [sec], it is determined that the etching processing has started at the time instant (Ti+0.1), that is, the time instant (Ti+0.1) is the start time instant of an etching period. Furthermore, in this embodiment, it is determined that the value of the remaining film thickness has reached the remaining film thickness De of the target end point at the time instant Te. Then, the remaining film thickness in the period from the time instant (Ti+0.1) to the time instant Te (period in which the etching processing progresses) is considered to change by a value $\Delta d'$ obtained by dividing the change amount (Di−De) of the remaining film thickness by the number of sampling time instants for each unit sampling time instant, and the remaining film thickness at each time instant is calculated. For example, a calculated value of the remaining film thickness at the time instant (TI+0.1) is (Di−$\Delta d'$), and the remaining film thickness at the time instant Tt=(Ti+0.1)×m [sec] is (Di−$\Delta d'$)×m.

On the other hand, in the comparative example, the time from the time instant 0 to the time instant Te including an unprocessing period between the time instant 0 and the time instant Ti is regarded as the period of the etching processing. A change Δd in the remaining film thickness per unit sampling interval is obtained by dividing the difference between the values Di and De of the remaining film thickness by the number of sampling time instants from the time instant 0 to the time instant Te (period of process/sampling interval). With the change Δd, the film thickness at the time instant 0.1 [sec] is calculated as (Di−Δd)×n and the film thickness at the time instant Tt is calculated as (Di−Δd)−(n+m) when the remaining film thickness at the time instant Ti is (Di−Δd) and there are n sampling time instants in the period from 0 to Ti.

In this manner, the data indicating a pattern of the spectrum and intensity of a plurality of pieces of interference light 15 used in the comparative example includes the unprocessing period in the period in which the etching processing is considered to be performed. Thus, an error occurs in the value of the remaining film thickness associated with such data. Furthermore, upon detection of the remaining film thickness during the processing of the wafers 14 for mass production of semiconductor devices using data in this manner, the actual remaining film thickness deviates from the desired value (film thickness error). The shorter the time of the process of processing the film to be processed or the process in which actual etching progresses, the greater the influence of the error and the lower the yield of the process.

Therefore, in this embodiment, as described above, after the time instant 0 at which the process is started, until the time instant (Ti+0.1) at which it is determined that the difference between the spectral waveform (or the change in the intensity corresponding to the predetermined wavelength (frequency) of the spectrum) obtained at each sampling time instant and the spectral waveform at an arbitrary time instant before the time instant (in this example, the previous sampling time instant) is larger than the predetermined threshold value, the interference light 15 indicating the change in the spectrum is determined to be in an unprocessed state in which the etching of the film to be processed is not in progress, and the remaining film thickness is detected using the data indicating the spectrum of the interference light 15 in the period in which the etching processing progresses from the time instant (Ti+0.1) to the time instant Te.

Figure 7:
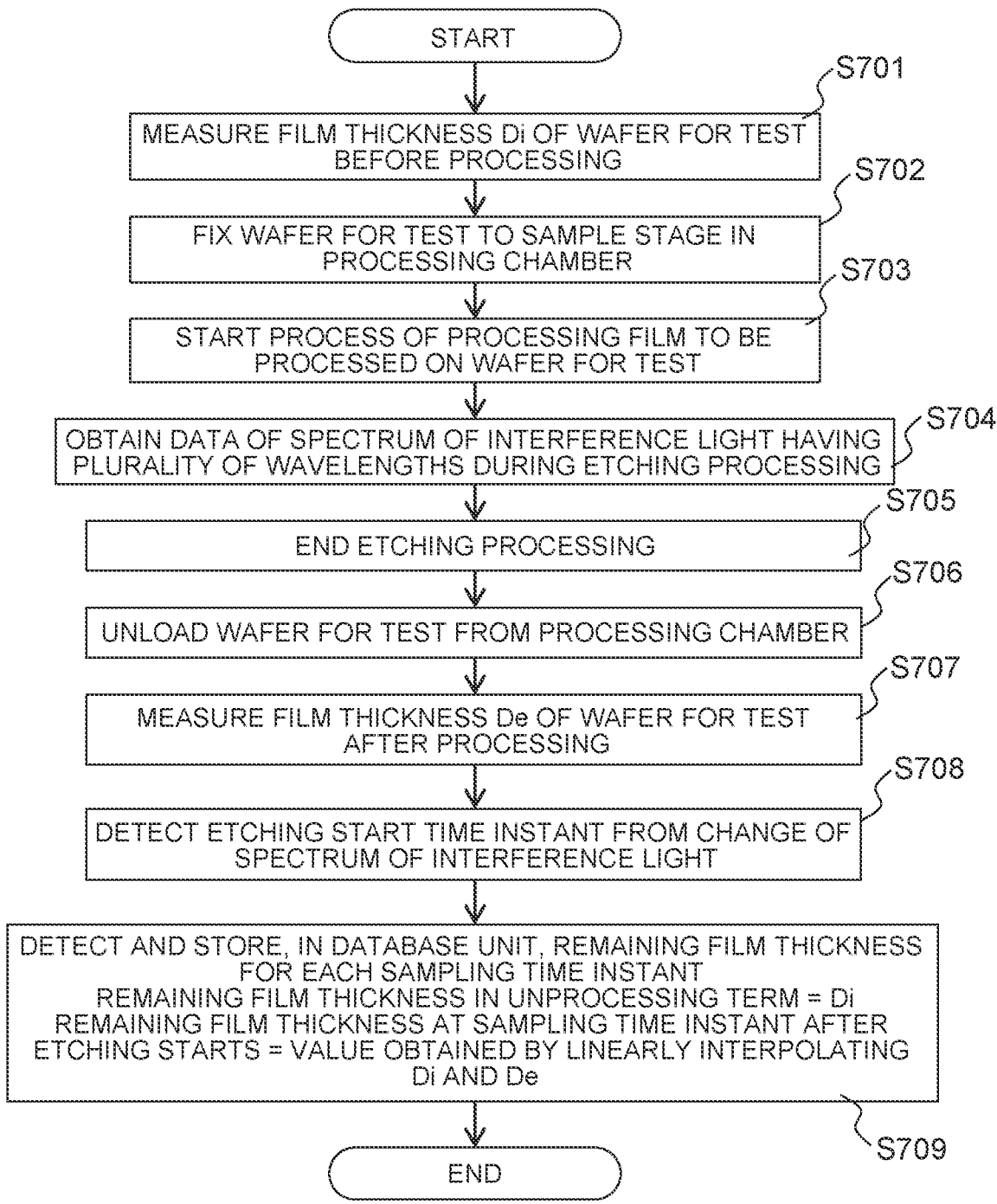
FIG. 7 is a flowchart illustrating a flow of an operation of storing film thickness and spectrum data including feature data of a spectrum of interference light in a database unit in the plasma processing apparatus according to the embodiment illustrated in FIG. 1.

FIG. 7 is a flowchart illustrating a flow of an operation of storing the film thickness and spectrum data including the feature data of the spectrum of the interference light in the database unit in the plasma processing apparatus according to the embodiment illustrated in FIG. 1. In this embodiment, as described above, before the start of the processing of the wafers 14 for mass-producing semiconductor devices, the feature data of the spectrum of the interference light 15 of a plurality of wavelengths accompanying s of f the etching processing of the film layer to be processed in the wafer 14 for test having the same configuration as the wafer 14 is stored in advance in association with the remaining film thickness of the film layer.

FIG. 7 illustrates a flow of operation performed in advance such as obtaining the above-described data as film thickness and spectrum data and storing the data in the database unit 30 in the film thickness and depth determiner 21. Upon start of the flow of operation, first, in step S701, the remaining film thickness Di of the film layer to be processed before the start of the process of processing the wafer 14 for test having a configuration (dimension and structure including the film formed on the surface) identical to the wafer 14 used in the process of mass-producing semiconductor devices or the equal wafer 14 for test that is so similar as to be regarded as identical is measured, and the remaining film thickness Di is recorded and stored in the storage device inside the controller 23.

In this step, the film thickness may be measured using any conventionally known measurement technique such as a sectional electron microscope (SEM), an optical critical dimension (OCD), or an atomic force microscope (AFM). Note that, in a case where data is actually obtained by etching processing in the processing chamber 19, it is preferable to use a wafer having the same lot as a wafer used for mass production as the wafers 14 for test.

Next, in step S702, the wafer 14 for test is conveyed into the processing chamber 19 inside the vacuum container 11 and placed and fixed on the sample stage 13.

In step S703, the process of the etching processing is started under conditions identical to or so similar as to be identical to the conditions of the wafer 14 for mass production. That is, the inside of the processing chamber 19 is maintained at a pressure of a degree of vacuum within a predetermined range, the plasma 12 is formed using the processing gas supplied to the processing chamber 19, the radio frequency power for bias potential formation is supplied to the electrode inside the sample stage 13, and the process is started. In this embodiment, the time at which this process is started is set as the time 0 during the period of the process.

In the plasma processing apparatus 10 according to this embodiment, at the time point when the process of processing the film to be processed is started and after the start, the film thickness and depth determiner 21 determines whether the remaining film thickness of the film layer to be processed has reached a predetermined target value using the spectrum of the interference light 15 from the wafer 14 received via the light receiver 16 at each sampling time instant of a predetermined interval, and in a case where the remaining film thickness has not reached the predetermined target value, the etching processing is continued until the determination is made.

That is, after the spectrum of the interference light 15 having the plurality of wavelengths from the wafer 14 received via the light receiver 16 at each sampling time instant is detected by the detection unit 17, the spectrum is processed by the signal processor 20 and transmitted to the film thickness and depth determiner 21, and the feature data of the spectrum of the interference light 15 having the plurality of wavelengths at each time instant is associated with the time instant (including the time point of the processing start) and recorded in the storage in the internal database unit 30 (step S704).

Note that, in this embodiment, the determination as to whether the remaining film thickness of the target film layer has reached the target value is performed by determining whether a time instant when a predetermined target film thickness is assumed to be reached has elapsed from the start of the processing or whether the number of sampling time instants has been reached.

Upon determination that the time when the desired film thickness is assumed to be reached has elapsed, the process proceeds to step S705, and the etching processing of the wafer 14 for test is completed. Further, in step S706, the wafer 14 for test is unloaded from the processing chamber 19.

After that, in step S707, the remaining film thickness De of the film layer to be processed of the wafer 14 for test is measured by a process similar to step S701, and is recorded and stored in the storage in the controller 23. In the steps so far, the remaining film thicknesses before and after the film layer to be processed of the wafer 14 for test is etched, and the feature data of the spectrum of the interference light 15 at each sampling time instant during the period of the process of etching the film layer is obtained.

In this embodiment, the change in the intensity of the light of each wavelength of the interference light 15 from the start time instant of the process or the change in the spectral waveform indicating the change in the intensity of the light with respect to the change in the wavelength of the interference light 15 is detected from the obtained feature data of the interference light 15.

In step S708, the comparator 31 in the film thickness and depth determiner 21 compares a magnitude of the amount of change with the predetermined threshold value, and the time instant when it is determined that the amount of change has exceeded the threshold value is detected as the time instant when the progress of etching has started.

In step S709, at each sampling time instant of the unprocessing period in which the etching processing does not proceed from the time instant 0 to the time instant at which the etching is started (time instant (Ti+0.1) seconds in FIG. 6), the remaining film thickness is detected as Di and associated with data at each time instant. Further, the value of the remaining film thickness at each sampling time instant after the etching start time instant is recorded and stored in the database unit 30 in association with the feature data of the spectrum at each time instant as a value obtained by linearly interpolating at each sampling time instant on the basis of the film thickness Di at the etching start time instant and the value of the film thickness De at the end point. In this way, the film thickness and spectrum data in which the feature data of the spectrum of the interference light 15 and the value of the remaining film thickness are associated with each other is stored in the database unit 30, the database is constructed, and the flow ends.

Note that the film thickness and depth determiner 21 preferably generates the film thickness and spectrum data (associated relationship between the film thickness and the spectrum) by allocating the film thickness before the etching processing to the etching start time instant and the spectrum before the etching start time instant, allocating the film thickness after the etching processing to the spectrum at the etching end time instant, and allocating the film thickness derived by linear interpolation with respect to the etching time to the spectrum between the etching start time instant and the etching end time instant.

Figure 8A:
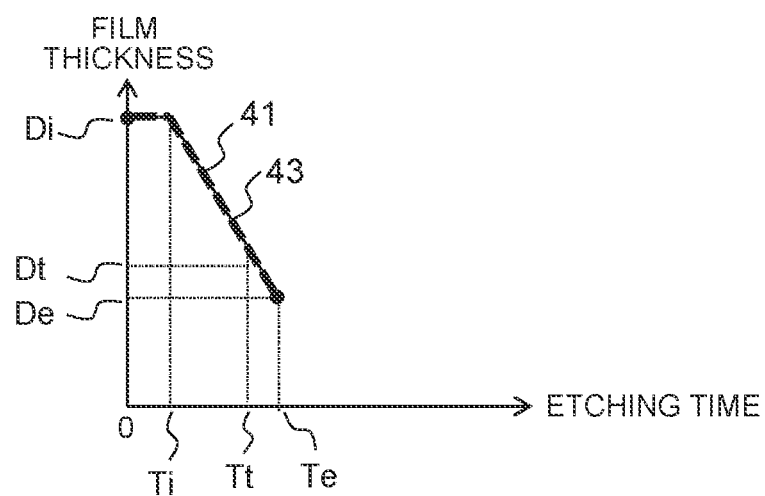
FIGS. 8A to B are schematic graphs illustrating an example of a remaining film thickness and an error at each sampling time instant in data of interference light used for detecting the remaining film thickness of the plasma processing apparatus according to the embodiment illustrated in FIG. 1.
Figure 8B:
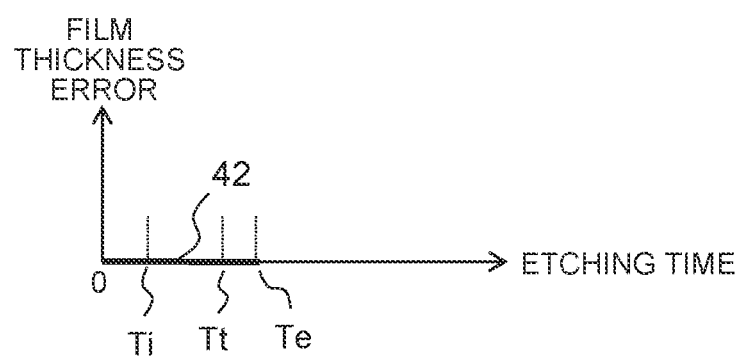

With reference to FIGS. 8A to 8B, the value of the remaining film thickness and a magnitude of the error at each sampling time instant in the data of the interference light 15 obtained in FIG. 7 will be described. FIGS. 8A to 8B are schematic graphs illustrating an example of the remaining film thickness and the error at each sampling time instant in the data of the interference light used for detecting the remaining film thickness of the plasma processing apparatus according to the embodiment illustrated in FIG. 1.

FIG. 8A illustrates a relationship between the remaining film thickness obtained from the film thickness and spectrum data stored in the database unit 30 and the actual remaining film thickness. FIG. 8B illustrates a difference (film thickness error) between the two remaining film thickness values illustrated in FIG. 8A.

In FIG. 8A, a horizontal axis represents time after the time point when the etching processing of the wafer 14 is started, and a vertical axis represents the remaining film thickness or depth of the film layer to be processed, and a magnitude of the error between the value of the remaining film thickness (depth) detected using the data and the actual value. The reference signs are the same as the reference signs in FIGS. 3A to 3B, and thus the description thereof will be omitted.

In FIG. 8A, as indicated by the solid line 41, an unprocessing period, which is an unprocessed state, occurs from the time instant 0 at which the plasma 12 is formed and the process of the etching processing is started to the time instant Ti immediately before the progress of etching of the film layer to be processed is started with the intensity of the plasma 12 stabilized. Thus, in the unprocessing period, the actual remaining film thickness is substantially constant, or the change of the remaining film thickness is within a predetermined threshold value. In this embodiment, even when such an unprocessing period occurs, the time instant at which the progress of the etching processing is started is detected from the change in the spectrum of the interference light 15, and the remaining film thickness is detected using the feature data of the spectrum at a time instant after the time instant.

For example, the feature data of the spectrum of the actual interference light 15 detected at an arbitrary time instant during the term of the process of processing the wafer 14 for mass production is compared with the feature data of the spectrum of the interference light 15 at the sampling time instant in the period in which the unprocessing period stored in the database unit is excluded. Then, the value of the remaining film thickness corresponding to the feature data having the smallest difference from the actual data among the feature data at each time instant is detected as the film thickness at the time instant.

Alternatively, upon determination that the change in the feature data of the spectrum of the interference light 15 is smaller than the predetermined threshold value at the sampling time instant in a predetermined initial period from the start of the process of processing the wafer 14 for mass production (time instant 0), the time instant is determined to be in the unprocessing period, and the remaining film thickness is regarded as the value Di before the process starts.

Further, after that, it is detected that the etching processing is started at the time instant when the magnitude of the change exceeds the threshold value. Then, the comparator 31 may compare the feature data of the spectrum of the interference light 15 detected at an arbitrary sampling time instant and after the start time instant (in the above example, time instant (Ti+0.1) seconds) with the film thickness and spectrum data in the database unit 30. The film thickness corresponding to the feature data of the detected spectrum may be extracted in the film thickness and spectrum data at the time instant as an instantaneous film thickness. Also, the remaining film thickness at the arbitrary time instant may be calculated as a calculated film thickness from the recursive analysis using a value of the instantaneous film thickness and the remaining film thickness detected at the sampling time instant during the etching processing before the arbitrary time instant. In this case, the remaining film thickness at the past sampling time instant used for the recursive analysis is a value of the calculated film thickness detected at a plurality of time instants after the time instant (Ti+0.1) seconds and recorded and stored in the database unit 30 or the controller 23.

In this manner, it is possible to determine whether the etching processing is not progressed or the progress of the etching processing is started from the feature data of the spectrum of the interference light 15. Thus, the remaining film thickness at each sampling time instant after the start of etching is calculated by using the feature data of the spectrum of the interference light 15 after the time point when the etching processing after the unprocessing period is started. Therefore, the value of the remaining film thickness indicated by a broken line 43 in FIG. 8A is also detected with high accuracy at each time instant of the period of the process of processing the wafer 14 in a case where the remaining film thickness is calculated by the recursive analysis. As a result, as indicated by the solid line 42 in FIG. 8B, the film thickness error, that is, the error between the detected remaining film thickness and the actual remaining film thickness is reduced.

Figure 9A:
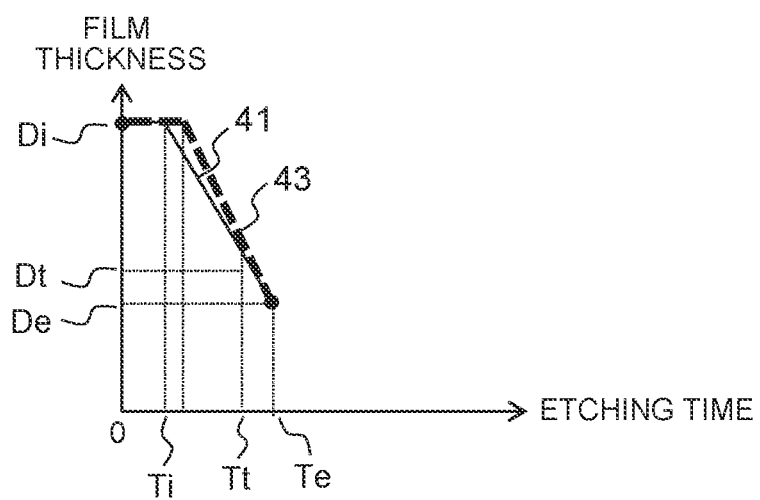
FIGS. 9A to 9B are graphs illustrating a relationship between a remaining film thickness detected during processing, a value of an actual remaining film thickness, and an error therebetween in a case where the time instant at which it is detected that a progress of etching is started is slightly delayed from the actual time instant in the plasma processing apparatus according to the embodiment illustrated in FIG. 1.
Figure 9B:
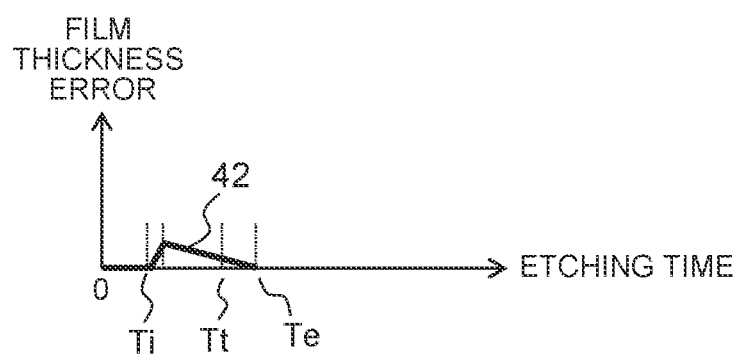

FIGS. 9A to 9B are graphs illustrating a relationship between the remaining film thickness detected during processing, the value of the actual remaining film thickness, and the error therebetween in a case where the time instant at which it is detected that a progress of etching is started is slightly delayed from the actual time instant in the plasma processing apparatus according to the embodiment illustrated in FIG. 1. FIG. 9A is a graph illustrating a change in the value of the remaining film thickness with a lapse of time with time on the horizontal axis, and FIG. 9B is a graph illustrating a change in the error with a lapse of time.

As illustrated in FIG. 9A, in a case where the progress of etching is started between sampling time instants next to each other before and after, the time instant at which the film thickness and depth determiner 21 or the controller 23 of the plasma processing apparatus 10 can determine the progress is the next sampling time instant at the earliest, and is slightly delayed from the actual time instant.

In this case, a deviation occurs between the actual change in the remaining film indicated by the solid line 41 and the detected change in the film thickness indicated by the broken line 43, and an error occurs. However, the difference can be made smaller than the difference between the solid line 40 and the broken line 41 illustrated in FIGS. 3 and 4, and therefore, the film thickness error can be reduced as indicated by the solid line 42 in FIG. 9B.

Although FIGS. 9A to 9B illustrate the case where the determination of the etching start time instant is delayed, it goes without saying that the same effect can be obtained even when the determination is advanced.

Next, a configuration of detecting a change in the spectrum of the interference light 15 in this embodiment will be described. FIGS. 10A to 10C and 11A to 11C are schematic graphs each illustrating the amount of change in the spectrum detected by the plasma processing apparatus according to the embodiment illustrated in FIG. 1.

In FIGS. 10A to 11C, the difference between the spectral waveforms at two consecutive sampling time instants of the interference light 15 detected by the plasma processing apparatus 10 is illustrated with the wavelength on the horizontal axis. In each drawing, the difference between the intensity of light of a plurality of wavelengths of the interference light 15 detected at six sampling time instants (time instant T=0.1, 0.3, Ti, (Ti+0.1), (Ti+0.2), (Ti+0.3) [sec]) after the start of the process of etching the film layer to be processed and the intensity of light at the immediately preceding sampling time instant is illustrated using the wavelength on the horizontal axis and a spectral difference (difference in the intensity of light) on the vertical axis.

As illustrated in these drawings, it can be seen that the spectral difference over a range of a predetermined plurality of wavelengths is smaller in 0.1 seconds or 0.3 seconds immediately after the time instant at which the plasma 12 is formed and the etching process is started than the spectral difference after the time instant Ti. This is because the etching of the film layer to be processed is not in progress, and the intensity change of the light of the plurality of wavelengths included in the interference light 15 is small. It is considered that a factor of changing the intensity of the interference light 15 with a lapse of time is that the intensity or distribution variation of the plasma 12 and a magnitude of a noise of the radio frequency flowing through an electric circuit used in the plasma processing apparatus 10 are all relatively small.

Figure 10A:
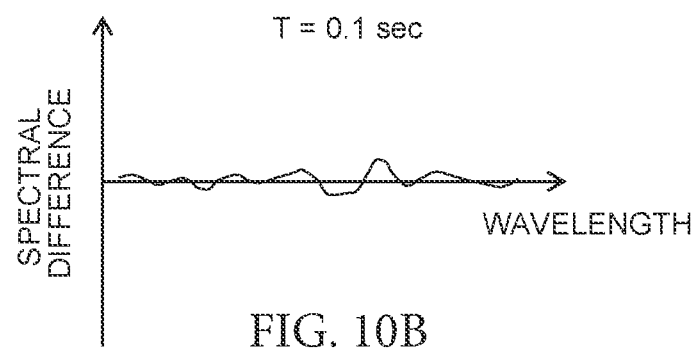
FIGS. 10A to 10C are schematic graphs illustrating an amount of change in the spectrum detected by the plasma processing apparatus according to the embodiment illustrated in FIG. 1.
Figure 10B:
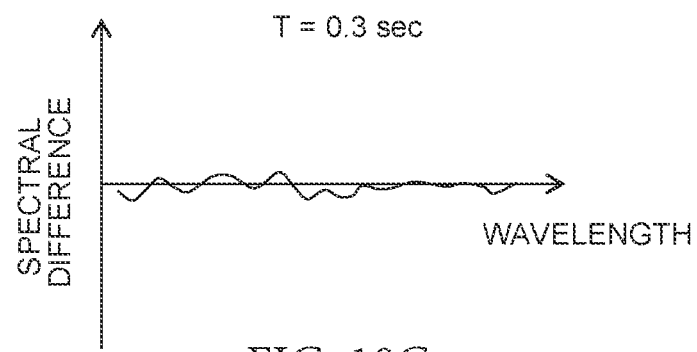
Figure 10C:
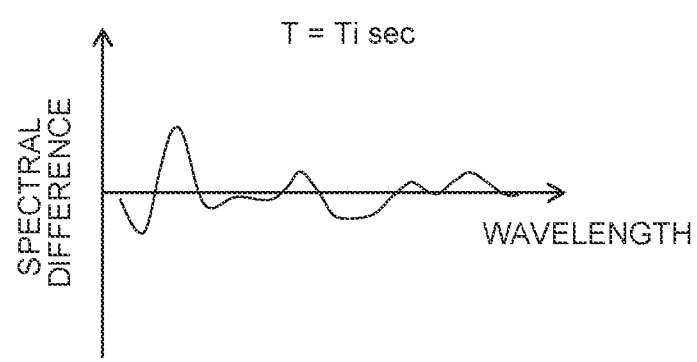
Figure 11A:
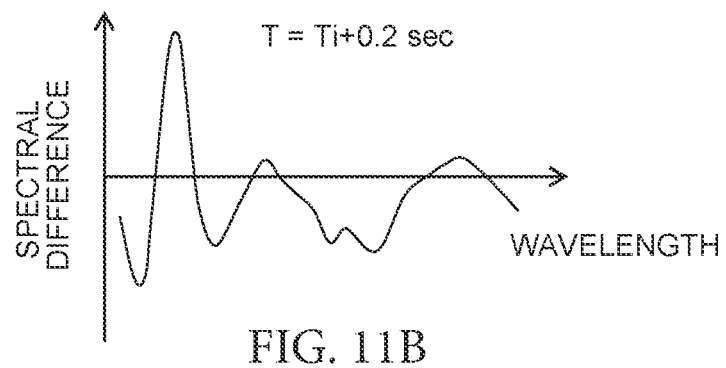
FIGS. 11A to 11C are schematic graphs illustrating the amount of change in the spectrum detected by the plasma processing apparatus according to the embodiment illustrated in FIG. 1.
Figure 11B:
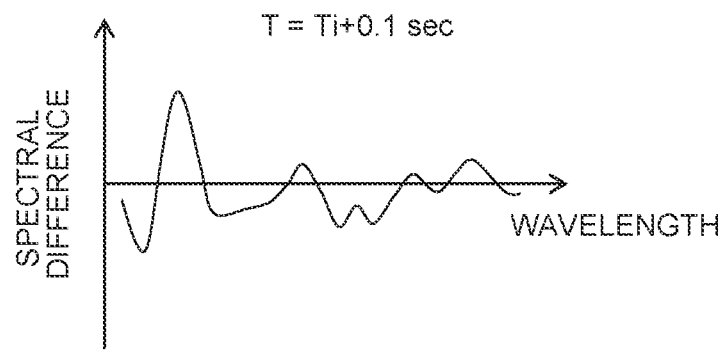
Figure 11C:
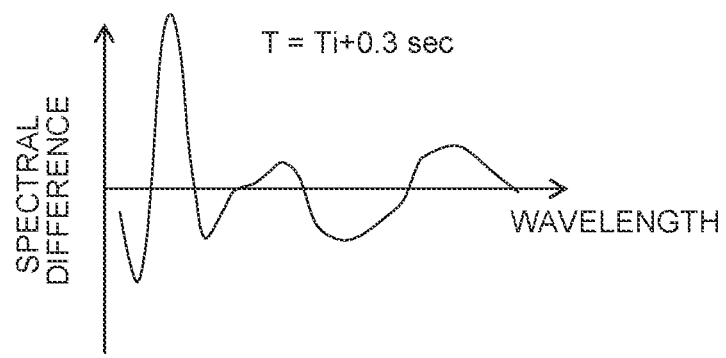

On the other hand, as illustrated in FIG. 11C, the spectral difference increases at a plurality of wavelengths at the time instant Ti seconds. This change indicates that the etching of the film layer to be processed for forming a circuit pattern on the wafer 14 has sufficiently progressed by the plasma 12 and the etching is started. Further, after the time instant Ti, the spectral difference at each of (Ti+0.1), (Ti+0.2), and (Ti+0.3) [sec] is larger than in FIGS. 10(a) and 10(b) illustrating the spectral difference at the time instant before Ti. In particular, it is found that the amount of the spectral difference (for example, a sum of the differences for each frequency) increases with a lapse of time.

Although not illustrated, the shape of the spectral difference varies but an absolute value change is not observed even at the sampling time instant after the time instant (Ti+0.3) seconds, and it is determined that a target material is stably etched. From these results, the time instant Ti at which the magnitude of the spectral difference from that at the immediately preceding time instant becomes larger than the predetermined threshold value can be detected as the time instant at which the etching processing of the film layer to be processed is started.

As described above, by detecting the spectral waveform of the interference light 15 or the intensity change of the light of a plurality of wavelengths using the spectral difference of consecutive two time instants, it is possible to accurately detect the time instant when the etching of the film layer to be processed is started.

The configuration of detecting the change in the spectrum is not limited to the above configuration. For example, a spectral ratio (intensity ratio) of specific wavelengths at two consecutive time instants may be calculated and compared with a predetermined threshold value to observe a spectral change. Further, a difference from or a ratio to an optical spectrum at each time instant calculated on the basis of an optical spectrum at a predetermined time instant (for example, immediately after the plasma 12 is formed and light emission occurs) may be used.

Next, another method of quantitatively detecting the start time instant of the etching processing will be described. In this method, the difference between the spectrum of the interference light 15 detected at each sampling time instant after the plasma processing apparatus 10 starts the process of etching the wafer 14 and the spectrum of the interference light 15 at the immediately preceding sampling time instant is calculated, and the time instant at which it is detected that a total value obtained by adding the difference for each sampling time instant exceeds a predetermined value is detected as the time instant at which the etching of the film layer to be processed is started.

Figure 12A:
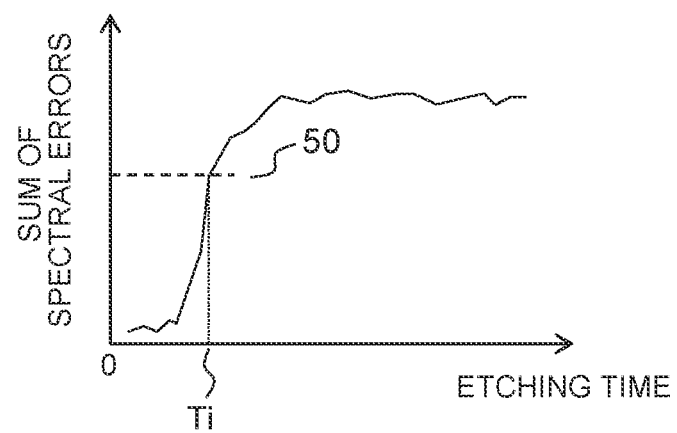
FIGS. 12A to 12B are schematic graphs illustrating a change with a lapse of time of a sum of differences between a spectrum of interference light 15 detected at each sampling time instant during processing of the wafer by the plasma processing apparatus according to the embodiment illustrated in FIG. 1 and a spectrum of the interference light 15 at an immediately preceding sampling time instant.
Figure 12B:
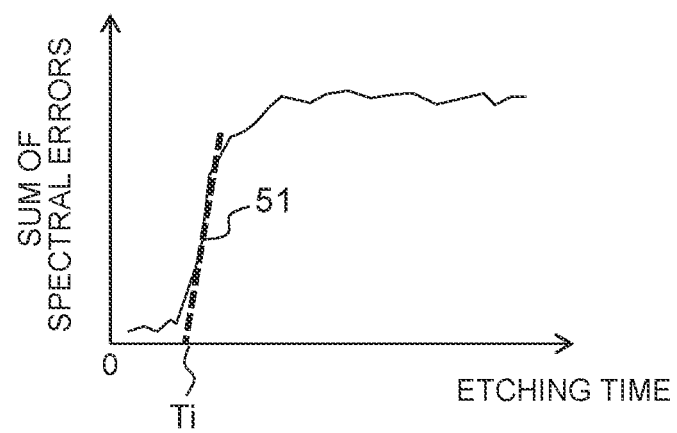

FIGS. 12A to 12C are schematic graphs illustrating a change with a lapse of time of a sum of differences (hereinafter, referred to as spectral differences) between the spectrum of the interference light 15 detected at each sampling time instant during processing of the wafer by the plasma processing apparatus according to the embodiment illustrated in FIG. 1 and the spectrum of the interference light 15 at the immediately preceding sampling time instant. In FIGS. 12A to 12C, the horizontal axis represents the time after the start of the process of etching the wafer 14, and the vertical axis represents the sum of the spectral differences.

Here, the spectral difference is a difference between the spectrum of the interference light 15 obtained at an arbitrary sampling time instant after the start of the above process and the spectrum of the interference light 15 at the immediately preceding sampling time instant. As illustrated in FIGS. 10 and 11, the intensity of each wavelength of the interference light 15 obtained at the two preceding and subsequent sampling time instants increases or decreases at each of the plurality of wavelengths of the interference light 15, and the difference between the intensities of these pieces of light is different and has positive or negative value at each wavelength. In this embodiment, the sum of the spectral differences is calculated at each sampling time instant after the time instant when the process of processing the wafer 14 is started, with a sum of the absolute values of these differences or a value obtained by calculating a sum of square values of the differences as the "sum of the spectral differences". The sum of the spectral differences can be feature data of the spectrum.

As illustrated in FIGS. 12A to 12C, the sum of the spectral differences calculated at the sampling time instant immediately after the start of the process of processing the wafer 14 using the plasma 12 is small, gradually increases with a lapse of time, and then rapidly increases.

Furthermore, a rate of the increase gradually decreases at a subsequent time instant and gradually approaches a predetermined value. In this embodiment, the time instant at which the sum of the spectral differences rapidly increases is detected and regarded as the time instant at which etching is started. The calculation of the spectral difference and the sum of the spectral differences and the detection of the time instant when the progress of etching is started are performed by the film thickness and depth determiner 21 or the comparator 31.

In the example illustrated in FIG. 12A, the film thickness and depth determiner 21 of the plasma processing apparatus 10 uses a threshold value 50 at each sampling time instant, and determines the sampling time instant at which it is detected that the sum of the spectral differences exceeds the threshold value 50 as the time instant Ti at which the etching processing is started.

Such a threshold value varies depending on the material and processing conditions of the film layer to be processed, and a user of the plasma processing apparatus 10 appropriately selects and determines a value of the sum of spectral differences that can be regarded as the start time instant of etching from the feature data of the spectrum of the interference light 15 obtained when the wafer 14 for test is processed in advance.

In the example illustrated in FIG. 12B, a change rate (inclination) of the sum of the spectral differences with respect to time is calculated at each sampling time instant, and the time instant Ti at which the etching processing is started is determined using an average value of a change rate 51 in a specific period. For example, after deriving a straight line including an average inclination 51 of target measurement points, a point Ti where the straight line intersects the horizontal axis is determined as the time point when the etching processing is started. This makes it possible to quantitatively obtain the etching start time instant. A method of determining Ti is not limited to an intersection of an average inclination straight line and the horizontal axis. In combination with the threshold value in FIG. 12A, an intersection of the threshold value and the average inclination straight line may be used.

As described above, it is possible to quantitatively determine the etching start time instant by plotting the sum of the spectral differences at two consecutive time instants at each time instant and setting the time instant Ti under an arbitrary condition such as the threshold value or the average inclination. Note that a wavelength range to be summed may be any region as long as the wavelength range is a sensitive arbitrary wavelength range. Further, in order to accurately recognize the change in the sum of the spectral differences, the vertical axis may be a logarithmic scale or the plot may be smoothed.

On the other hand, when the sum of the spectral differences changes over a relatively long period, it is considered that the progress of etching of the film layer to be processed changes such that a speed and degree of the progress gradually increase. In such a case, it is considered to be difficult to cope with the case only by detecting the start time instant of the etching processing with the configuration described in the embodiment and shifting the value of the remaining film thickness and the determination of the detection of the end point after the unprocessing period before the start time instant. Next, a modification for accurately detecting the remaining film thickness in such a case will be described.

Figure 13:
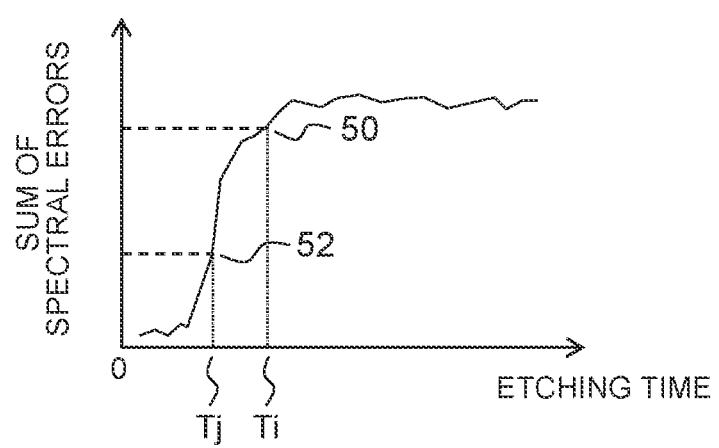
FIG. 13 is a schematic graph illustrating a change with a lapse of time of a sum of spectral differences of interference light detected by a plasma processing apparatus according to a modification of the embodiment illustrated in FIG. 1.

FIG. 13 is a schematic graph illustrating a change with a lapse of time of a sum of the spectral differences of the interference light detected by a plasma processing apparatus according to a modification of the embodiment illustrated in FIG. 1. In this modification, when the value of the sum of the spectral differences gradually increases in a relatively long period after the start of the process of processing the wafer 14 as described above, the time instant of the start of the etching process is detected using a plurality of threshold values.

That is, as illustrated in FIG. 13, also in this modification, similarly to the example illustrated in FIG. 12A to 12C, the value of the sum of the spectral differences calculated at the sampling time instant immediately after the start of the process of processing the wafer 14 gradually increases with a lapse of time and then rapidly increases, and the rate of increase gradually decreases at the subsequent time instant and gradually approaches the predetermined value. In a state where the value of the graph illustrated in the drawing gradually approaches the predetermined value, it is considered that stable etching is started. The sum of such spectral differences decreases and starts to gradually approach the predetermined value at the sampling time instant when the change rate (increase rate) with respect to time reaches the threshold value 50.

In this modification, together with this threshold value 50, two thresholds are set in advance with the value of the sum of the spectral differences at the sampling time instant at which the value of the sum of the spectral differences starts to increase as a second threshold value 52. The two threshold values are recorded and stored in the storage in the controller 23 or the film thickness and depth determiner 21 as feature data of the spectrum. The second threshold value 52 is assumed to be a sum of spectral differences when an etching rate of the film layer to be processed increases and etching obviously starts to progress.

In this modification, the film thickness and depth determiner 21 determines the sampling time instant at which the sum of etching differences reaches the threshold value 50 as the time instant Ti at which the etching is started, and further determines the sampling time instant at which the sum of the etching differences reaches the threshold value 52 as a time instant Tj at which the etching rate starts to change (change is started), and detects change points of two etching rates.

In other words, it can be said that there are two inflection points when the change rate of the sum of the etching differences with respect to time illustrated in FIG. 13 is approximated with a curve. In this case, the time instant Tj of a temporally preceding first inflection point is set as the etching start time instant, and the time instant of a temporally following second inflection point is set as Ti.

Figure 14A:
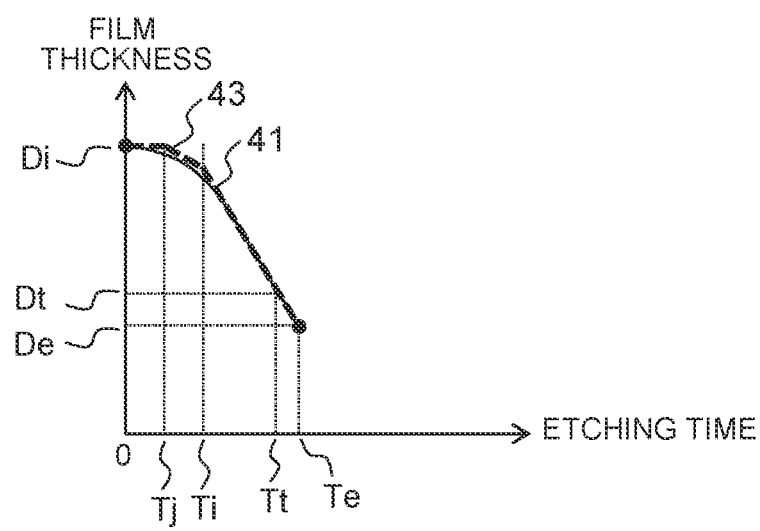
FIGS. 14A to 14B are schematic graphs illustrating an example of the remaining film thickness and the error at each sampling time instant in the data of interference light used for detecting the remaining film thickness of the plasma processing apparatus according to the modification of the invention illustrated in FIG. 13.
Figure 14B:
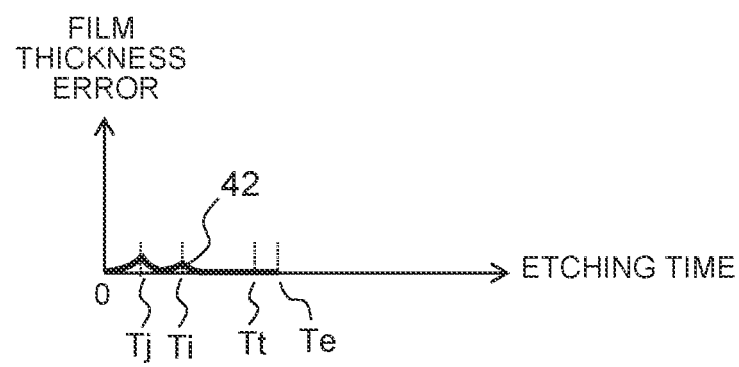

FIGS. 14A to 14B are schematic graphs illustrating an example of the remaining film thickness and the error at each sampling time instant in the data of interference light used for detecting the remaining film thickness of the plasma processing apparatus according to the modification of the invention illustrated in FIG. 13. FIG. 14A illustrates a relationship between the remaining film thickness obtained from the film thickness and spectrum data stored in the database unit 30 and the actual remaining film thickness. FIG. 14B illustrates a difference (film thickness error) between the two remaining film thickness values illustrated in FIG. 14A.

In FIGS. 14A to 14B, a horizontal axis represents time after the time point when the etching processing of the wafer 14 is started, and a vertical axis represents the remaining film thickness or depth of the film layer to be processed, and a magnitude of the error between the value of the remaining film thickness (depth) detected using the data and the actual value. The reference signs are the same as the reference signs in FIGS. 3A, 3B and 13, and thus the description thereof will be omitted.

As indicated by the solid line 41 illustrated in FIG. 14A, in a predetermined period from immediately after etching is started in the process of processing the wafer 14, the processing conditions such as a state of the plasma become unstable, and the remaining film thickness to be detected may also change largely. In this case, as indicated by the broken line 43, in a period from immediately after the start of the process (time 0) to the sampling time Tj, the change in the spectrum of the interference light 15 is smaller than a predetermined threshold value and in the unprocessed state, that is, the remaining film thickness is the same as before the start and is constant. On the other hand, a period after the time Ti (second section) is a stable period in which the characteristics of the plasma are stable and the remaining film thickness changes (decreases) at a stable speed within a range in which variation is small. Furthermore, in this modification, in the time from the time instant Tj to the time instant Ti (first section) between the stable period and an initial unprocessing period, the etching is considered to progress at a rate smaller than a ratio (rate) of decrease of the remaining film thickness in the stable period, and the small etching rate is set. That is, an etching rate in the second section is higher than an etching rate in the first section.

In this modification, in a period during which the etching condition transitions until the plasma condition is stabilized from an initial state and a rate at which the etching processing rate of the wafer 14 is stabilized changes, data that is considered to be an etching rate of a value smaller than the etching rate in a stable state is used. Thus, as compared with the embodiment in FIGS. 8A to 8B, even when a transition period is relatively long in the processing of the wafers 14 for mass-producing semiconductor devices, the error between the detected remaining film thickness of the film layer to be processed and the actual remaining film thickness is narrowed as indicated by the solid line 42 in FIG. 14B.

In this modification, two values are set in advance as threshold values to be used, but it goes without saying that the threshold values are not limited to two. Further, the values of the threshold values varies depending on the processing conditions such as a type of the film layer to be processed of the wafer 14 and a pressure in the processing chamber 19, the values are not limited to the example illustrated in FIG. 13. In addition, a type of values different from the threshold values, such as the average value of inclinations with respect to a temporal change of the sum of spectral differences, may be used, and two or more values and two or more time instants respectively corresponding to the two or more values may be detected to determine the remaining film thickness.

As described above, in this modification, in a case where the etching rate gradually changes until the progress of etching of the film layer to be processed is started and the etching rate is stabilized after the process of processing the film layer to be processed of the wafer 14 is started, a plurality of time instants corresponding to a plurality of threshold values of a predetermined etching rate is detected. Furthermore, in the data of the interference light 15 used in this modification stored in advance in the database unit 30, the range of the etching rate to be detected is set for each of a plurality of periods divided at these time instants, and the change in the remaining film thickness with a lapse of time is set such that upper and lower limit values of the range of the etching rate in the plurality of periods increase uniformly with a lapse of time. As a result, the difference from the actual value of the remaining film thickness is reduced in the process of processing the actual wafers 14 for mass production, and thus the remaining film thickness or depth is detected and whether the target film thickness is reached is determined with high accuracy.

Figure 15:
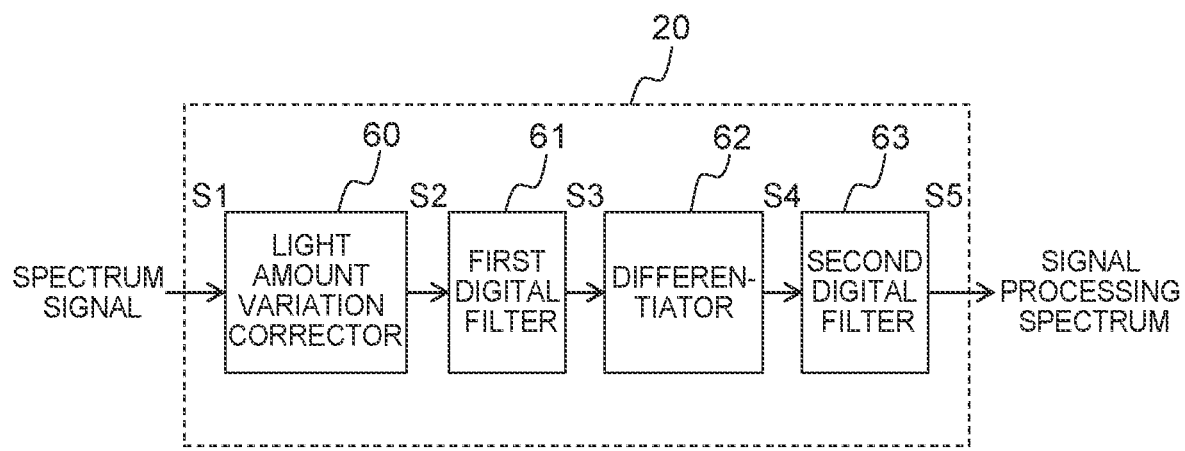
FIG. 15 is a schematic block diagram of a configuration of a signal processor of the plasma processing apparatus according to the embodiment illustrated in FIG. 1.

An operation in which the plasma processing apparatus 10 according to the embodiment or modification processes the signal of the interference light 15 received by the light receiver 16 will be described with reference to FIG. 15. FIG. 15 is a schematic block diagram of a configuration of the signal processor of the plasma processing apparatus according to the embodiment illustrated in FIG. 1.

In FIG. 15, the signal indicating the interference light 15 received by the light receiver 16 is transmitted to the detection unit 17 through an optical fiber, and intensity for each of a plurality of predetermined wavelengths is detected and transmitted to the signal processor 20 as a signal (spectrum signal) S1 indicating the intensity as a spectrum.

The spectrum signal S1 is introduced into a light amount variation corrector 60, is subjected to correction for reducing a component included signal and indicating a variation in the light amount, such as a fluctuation in the intensity of light from the plasma 12 and a temporal change in an optical transmittance in a transmission path of light from the processing chamber 19 via the light receiver 16, and becomes a signal S2. The signal S2 is smoothed through a first digital filter 61, and a radio frequency noise component caused by fluctuations in the intensity of light emission of plasma and electric noise is reduced to become a signal S3.

The signal S3 is introduced into a differentiator 62 and differentiated in order to reduce an included DC offset component and becomes a signal S4. The signal S4 is subjected to smoothing processing through a second digital filter 63, and becomes a signal S5 in which a noise component generated by the processing of the differentiator 62 is reduced. The obtained signal S5 is transmitted to the film thickness and depth determiner 21 as a signal processing spectrum.

Next, filtering in the first digital filter 61 and the second digital filter 63 in the signal processor 20 and differential processing in the differentiator 62 will be described. In the first digital filter 61 of this example, for example, a second-order Butterworth low-pass filter is used. The signal S2 transmitted to the first digital filter 61 is converted into the signal S3 obtained by the following equation (1) by an internal second-order Butterworth low-pass filter.

$$S3(i) = b1*S2(i) + b2*S2(i-1) + b3*S2(i-2) - [a2*S2(i-1) + a3*S2(i-2)] \quad (1)$$

Here, the low-pass filter of the first digital filter 61 of this example performs processing not in a time axis direction (with respect to change in time) but in a wavelength axis (frequency) direction (with respect to change in frequency). In the above equation, Sk (i) indicates data of a signal having a wavelength i of a predetermined signal, and coefficients bk and ak are low-pass filter coefficients derived from a sampling frequency (1/sampling interval) of the signal and a cutoff frequency set in the low-pass filter.

In this filtering processing, although a correct calculation result can be outputted when data that precedes two data pieces is a correct value, in a case where the filtering processing is performed in the time direction, t=0 seconds (sec), that is, immediately after the plasma 12 is formed and the process of processing the film layer to be processed of the wafer 14 is started, there is no data, and thus, the value of the signal S3 loses accuracy.

On the other hand, in the case of performing the filtering processing in the wavelength direction, the plasma 12 is formed at all wavelengths except for two points of upper and lower limits of the range (band) of the frequency (wavelength) to be detected, and the processing can be stably performed with high accuracy immediately after the processing of the wafer 14 is started.

In the differentiator 62, a conventionally known data processing method, for example, a Savitzky-Golay (S-G) method is used for the signal S3 to smooth the signal. The S-G method smooths data using a polynomial obtained by approximating data to be smoothed and a plurality of pieces of data preceding and subsequent or near the data to be smoothed or in a height direction as a polynomial curve. Furthermore, a differential value can be calculated and outputted using a coefficient of the polynomial. For example, when a signal obtained by smoothing by the S-G method and calculating differential values using a total of five values of each data piece and two data pieces before and after each data piece of the signal S3 is outputted as a signal S4, the signal S4 is obtained by the following equation (2).

$$S4(i) = c(-2)*S3(i-2) + c(-1)*S3(i-1) + c(0)*S3(i) + c(1)*S3(i+1) + c(2)*S3(i+2) \quad (2)$$

Here, in a first order differentiation, differentiation processing is performed not in the time axis direction but in the wavelength axis direction as described above. In the above equation, Sk(i) represents a value of a predetermined wavelength i of a signal, and a coefficient c (k) is a weighting coefficient determined from a polynomial order in differentiation of an arbitrary order and the number of windows. The differentiator 62 outputs, as a result, a differential value calculated using data indicating a value of one arbitrary frequency (wavelength) to be detected among signals indicating the spectrum of the interference light 15 and values of two frequencies before and after the value.

In a case of differentiation in the time axis direction, two pieces of data at the sampling time instant after the sampling time instant corresponding to the data to be smoothed are used. Thus, the smoothing processing of the target data cannot be performed until two sampling intervals elapse, and a delay occurs. Therefore, similarly to the filtering processing in the first digital filter 61, immediately after the time instant (time instant 0) at which the plasma 12 is formed and the process of processing the target film layer is started, there is no data before this time instant, and the smoothing or differentiation processing cannot be performed.

On the other hand, in a case where the smoothing or differential processing is performed in the wavelength axis direction, in principle, data at the past sampling time instant is not required for the processing, and the processing can be performed with high accuracy after the time instant 0 at which the process is started except for the upper and lower limits of a plurality of wavelength ranges. The flow of the filtering processing of the second digital filter 63 is similar to that of the first digital filter 61, and thus the description thereof will be omitted.

As described above, in the embodiment or the modification, the signal processor 20 performs the filtering processing, the smoothing processing, or the differentiation processing in the wavelength direction on the spectrum signal S1 of the detected interference light 15. Thus, the noise can be removed and the differentiation processing are performed stably and highly accurately immediately after the plasma 12 is formed and the processing of the film layer to be processed on the surface of the wafer 14 is started, and the S/N ratio is improved. This improves the accuracy of detection of the remaining film thickness in the film thickness and depth determiner 21 to which the outputted signal S5 is transmitted.

The filtering processing is not limited to the Butterworth low-pass filter as described above, and another low-pass filter may be used. Further, the processing of the signal in the differentiator 62 is not limited to the configuration of calculating the smoothing by the S-G method and the first-order differentiation using the five data pieces including the above-mentioned target and the preceding and following targets. A second-order differentiation and a higher order differentiation may be used, and the number of data pieces is not limited to five. In addition, as a smoothing method, a technique other than the S-G method may be used.

Further, the order and the number of times of the signal processing are not limited to the configuration illustrated in FIG. 15. The order of the processing may be changed, and the configuration of the signal processor 20 may be different from the configuration in FIG. 15 depending on the number of times selected in accordance with an obtained quality of the signal. In addition, in order to extract an interference component of a target spectrum for which the processing is started, for example, a spectrum of a silicon substrate or a background may be measured in advance, and a relative ratio of the spectrum may be used.

The above example has a configuration in which the signal indicating the spectrum of the obtained interference light 15 is subjected to the signal processing in the frequency (wavelength axis) direction in an initial period in which the etching is not in progress or in a period of a process after the time instant (time instant Ti) at which the etching of the target film starts, in addition to immediately after the start of the process of processing the target film layer of the wafer 14. In this case, in the film thickness and spectrum data stored in advance in the database unit 30 to be compared in order to detect the remaining film thickness and depth by the comparator 31 of the film thickness and depth determiner 21, a pattern of values obtained by differentiating the intensity of light of a plurality of frequencies (wavelengths) of the interference light 15 at an arbitrary sampling time instant with respect to the frequency direction is recorded in association with a plurality of values of the remaining film thickness of the target film.

On the other hand, in the signal processor 20, the signal may be processed in the frequency direction for the spectrum of the detected interference light 15 in an initial period from the start of the process of processing the wafer 14 to the detection of the progress of etching, and the signal may be processed in the time axis direction during the period of processing after the time instant Ti at which the etching processing is started. Alternatively, immediately after the start of the process and during the initial period, the spectrum of the detected interference light 15 may be processed in parallel in each of the time axis direction and the frequency (wavelength axis) direction, and a signal consequently obtained in each direction may be outputted to the film thickness and depth determiner 21. In this case, in the film thickness and spectrum data stored in advance in the database unit 30 to be compared in order to detect the remaining film thickness and depth by the comparator 31 of the film thickness and depth determiner 21, a pattern (having the wavelength as a parameter) of values obtained by differentiating the intensity of light of a plurality of wavelengths of the interference light 15 at an arbitrary sampling time instant with respect to the time axis direction is recorded in association with a plurality of values of the remaining film thickness of the target film.

In the embodiment or the modification, the above configuration improves the accuracy of the association between the pattern of the interference light 15 at the plurality of sampling time instants and the remaining film thickness in the film thickness and spectrum data recorded and stored in advance in the database unit 30. This improves the accuracy of detection of the remaining film thickness from the spectrum obtained from the interference light 15 during the processing of the wafers 14 for mass production using the data.

Further, the value of the target remaining film thickness can be accurately obtained, and it is therefore not necessary to perform a conventionally necessary process of calibrating the difference between the remaining film thickness calculated from data for detection and the actual remaining film thickness, and as a result, a cost of processing the wafer 14 is reduced. Further, the remaining film thickness or the change thereof can be detected with high accuracy in an initial period immediately after the plasma 12 is formed for the processing of the wafer 14 and the process of the processing is started. It is therefore possible to detect the etching amount and the depth with higher accuracy than that of the conventional technique in which the time instant at which the etching amount of the film layer to be processed exceeds the predetermined threshold value and the progress is started is detected and the remaining film thickness is detected on the assumption that the etching also progresses in the initial period.

Further, an initial state such as the remaining film thickness of the film layer to be processed of the loaded unprocessed wafer 14 can be detected. For example, in a case where the comparator 31 or the controller 23 determines that a deviation between the detected feature data of the spectrum of the interference light 15 and the film thickness and spectrum data in the database unit 30 is large, it is possible to notify or warn the user of the plasma processing apparatus 10 or a management system and to stop the process of processing the wafer 14.

Note that the configuration of the apparatus, the processing conditions of the wafer 14, the conditions for detecting the interference light 15, and the like illustrated in the embodiment or the modification are examples, and it is obvious that the invention is also applicable to other configurations and conditions. Further, the above example is an example of detecting the remaining film thickness of the film layer to be processed of the wafer 14, but it goes without saying that the invention is also applicable to a groove depth of a line-and-space shape, a hole depth of a hole shape, and the like of a circuit structure of a semiconductor device.

In the embodiment or the modification described above, there is provided a configuration in which interference light formed by reflection of light emitted from the plasma 12 formed inside the processing chamber 19 by a surface of a film layer constituting a film structure on the surface of the wafer 14 or a plurality of surfaces having different height positions including a boundary surface between two film layers stacked vertically is received as the interference light 15 by the light receiver 16 disposed on an upper part of the vacuum container 11.

On the other hand, in recent years, with the improvement in a degree of integration of semiconductor devices, a width and a hole diameter of a groove of the pattern of the circuit are reduced, an area exposed to the processing chamber 19 or the plasma 12 of the film layer to be etched on the surface of the wafer 14 is reduced, and the intensity of light emission of the plasma 12 formed for processing also tends to be reduced. Thus, in these examples in which the plasma 12 is used as a light emission source, the intensity of light emission of the plasma 12 becomes small as a whole, and thus, the ratio of the component of fluctuation or noise of the plasma 12 included in the interference light 15 becomes relatively large, that is, the S/N ratio of the spectrum of the interference light 15 becomes poor, and the accuracy of detection of the remaining film thickness and depth using the interference light 15 is more likely to be adversely affected.

Figure 16:
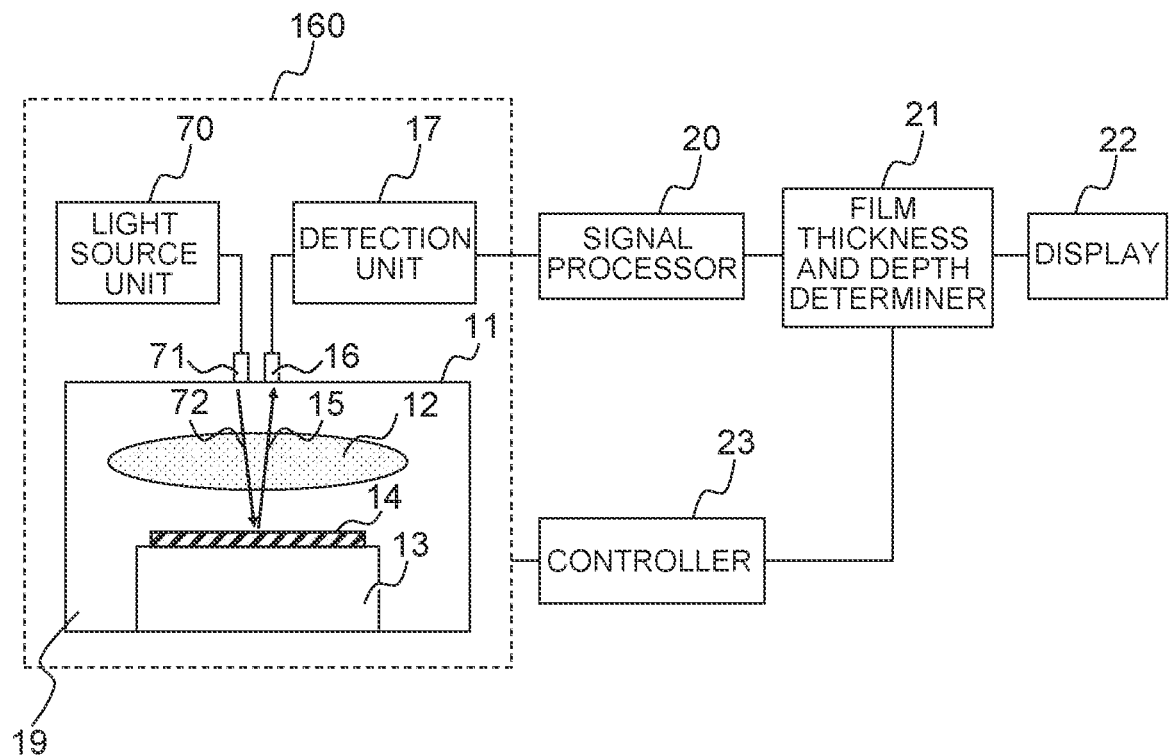
FIG. 16 is a schematic longitudinal sectional view of a general configuration of the plasma processing apparatus according to a modification of the embodiment illustrated in FIG. 1.

In relation to the above problem, descriptions will be made with reference to FIG. 16 about an example of a plasma processing apparatus capable of suppressing degradation of the S/N ratio of the spectrum of the interference light 15 and stably performing highly accurate detection even in a case where the intensity of light emission of the plasma 12 is small. FIG. 16 is a schematic longitudinal sectional view of a general configuration of the plasma processing apparatus according to the modification of an embodiment illustrated in FIG. 1.

A difference between a plasma processing apparatus 160 of this example and the plasma processing apparatus 10 according to the embodiment illustrated in FIG. 1 is that the plasma processing apparatus 160 includes a light source unit 70 above the vacuum container 11, and has a configuration of irradiating with light the surface of the wafer 14 disposed on an upper surface of the sample stage 13 disposed inside from outside above the processing chamber 19. Elements denoted by the same reference signs as those in the embodiment illustrated in FIG. 1 have the same configurations and functions as those in the embodiment, and description of such elements will be omitted below unless necessary.

The light source unit 70 of this modification includes, for example, a lamp such as an LED, a xenon lamp, or a halogen lamp as a light source, and has a configuration capable of irradiating the surface of the wafer 14 with light having a wavelength and a light amount in a necessary range in order to detect the remaining film thickness or depth in the film thickness and depth determiner 21 as the light source. The light emitted and radiated from the lamp of the light source unit 70 is transmitted through a light transmission path including a material having translucency such as an optical fiber connected to the light source unit 70, and is emitted as an irradiation light 72 toward a predetermined range of the wafer 14 from an irradiation lens 71 attached to the upper part of the vacuum container 11 and having a lower end facing inside of the processing chamber 19.

The irradiation light 72 is reflected by a plurality of surfaces of the film structure on the surface of the wafer 14 together with the light emitted from the plasma 12 to become interference light 15, is received by the light receiver 16, and is transmitted to the detection unit 17 via a light transmission path such as an optical fiber disposed above and connected to the light receiver 16. The configurations, functions, and operations of the detection unit 17, the signal processor 20, the film thickness and depth determiner 21, the display 22, and the controller 23 are the same as those of the embodiment illustrated in FIG. 1.

Here, the intensity of the light of the irradiation light 72 emitted from the light source unit 70 and applied to the wafer 14 is preferably sufficiently stronger than the intensity of the light emission of the plasma 12. The light emission of the plasma 12 becomes unstable immediately after the plasma s formed depending on the processing conditions, and a large fluctuation in intensity may occur. Then, this fluctuation is detected as a change in the spectrum of the interference light 15 at the sampling time instant during the initial unprocessing period before the time instant Ti at which the progress of etching is started, and the time instant at which the progress of etching is started is prevented from being accurately detected.

On the other hand, in this modification, the light source unit 70 capable of emitting the irradiation light 72 having sufficient intensity is used, and external light having a larger light amount than that of the plasma 12 is emitted during the period of the process of processing the film layer to be processed of the wafer 14. As a result, the intensity of the interference light 15 is dominantly due to the irradiation light, the influence of the light emission or the fluctuation of the intensity of the plasma 12 on the fluctuation of the intensity of the interference light 15 having a plurality of wavelengths is reduced, and the influence on the detection of the remaining film thickness and depth using this influence is suppressed.

Figure 17:
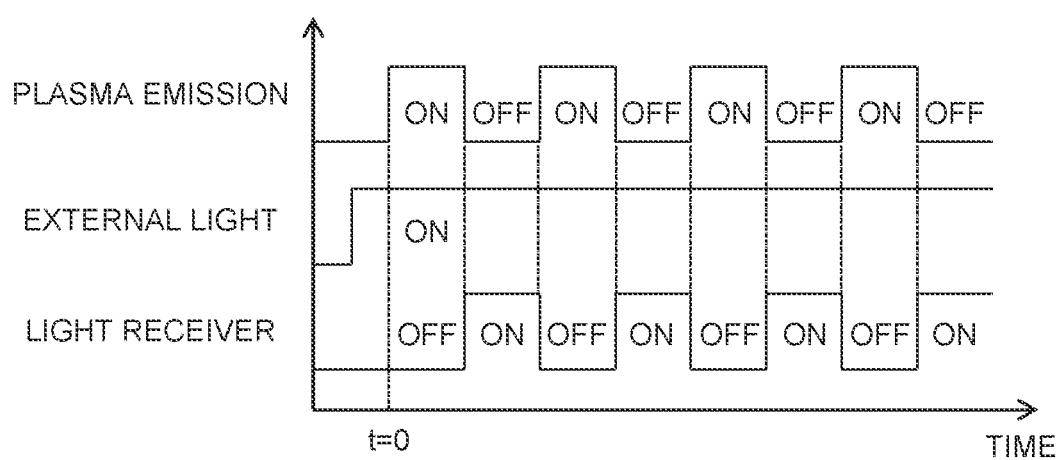
FIG. 17 is a schematic time chart illustrating a flow of an operation of the plasma processing apparatus according to the modification illustrated in FIG. 16.

An example of the operation of suppressing the degradation of the S/N ratio of the spectrum of the interference light 15 in the plasma processing apparatus 160 illustrated in FIG. 16 will be described with reference to FIG. 17. FIG. 17 is a schematic time chart illustrating a flow of the operation of the plasma processing apparatus according to the modification illustrated in FIG. 16. In particular, in FIG. 17, the increase and decrease with a lapse of time of the light emission of the plasma 12, the irradiation light 72 from the light source unit 70, and the light amount of the interference light 15 received by the light receiver 16 are indicated by solid lines as a graph.

In this modification, the configuration of the plasma processing apparatus 160 is the same as in FIG. 16. On the other hand, in the formation of the plasma 12, the irradiation of the irradiation light 72 from the light source unit 70, and the reception of the interference light 15 in the light receiver 16, the operations based on the command signal from the controller 23 that transmits and receives signals to and from these units are different.

In this modification, a predetermined ON period and a subsequent OFF period are switched at the time t=0 when the plasma 12 is formed, the formation of the plasma 12 and the light emission by this formation are repeated at a predetermined cycle, and a process of etching the film layer to be processed is performed. Furthermore, in the light source unit 70, light emission is continuously performed until it is detected by the film thickness and depth determiner 21 or the controller 23 that the irradiation of the irradiation light 72 is started before the time instant 0 and the end point of the etching processing of the film layer to be processed is reached.

On the other hand, the light receiver 16 is adjusted in an opposite manner as in the ON period and the OFF period of the periodically repeated light emission of the plasma 12, that is, such that the interference light 15 is received (the light receiver 16 is turned on) during the OFF period of the plasma 12, and is not received (the optical receiver 16 is turned off) during the ON period of the plasma 12.

By performing such an operation, the interference light 15 by the irradiation light 72 is received by the light receiver 16 in a period in which there is no light emission of the plasma 12 or the light amount of the plasma 12 is small. The light amount from the plasma 12 received by the light receiver 16 is 0 or sufficiently small, and thus the noise component caused by the plasma 12 is reduced. As a result, it is possible to stably detect the remaining film thickness or depth and determine whether the end point is reached.

Note that the time chart illustrated in FIG. 17 is merely an example, and another ON/OFF control can be performed. In any case, it is desirable that the light receiver 16 is turned off when the plasma is turned on, and the irradiation light 72 and the light receiver 16 is turned on when the plasma 12 is turned off.

Note that, in the example described above, there is described a configuration in which the remaining film thickness and depth are detected in a case where the film layer to be processed on the surface of one wafer 14 is continuously processed, but the above configuration is also be applicable to other processes of processing. For example, it is possible to stably follow, by similar processing, the film thickness in a cycle etching process in which etching is repeatedly performed with a plurality of processes as one cycle or a multi-step process in which multiple processes of etching processing is performed.

In the invention, the plasma processing apparatus that performs the etching processing on a processing target disposed in the processing chamber inside the vacuum container by using the plasma formed in the processing chamber includes at least the light receiver that receives light from inside the processing chamber at a plurality of predetermined time instants during the etching processing, the determiner that determines the etching amount of the processing target by using optical spectrum data of a plurality of predetermined wavelengths detected from an output of the light receiver, a film thickness amount before and after the etching processing, optical spectrum data, and a film thickness amount, in which the determiner can determine an etching start time instant from a spectrum change of the optical spectrum data, derive a film thickness amount corresponding to the optical spectrum data, and determine the etching amount of the processing target.

In the invention, the determiner of the plasma processing apparatus can determine the etching start time instant from the difference between the optical spectra at two consecutive time instants in the optical spectrum data.

In the invention, the determiner the plasma processing apparatus can determine the etching start time instant by using the sum of predetermined wavelength bands of the differences in the optical spectra.

In the invention, the determiner of the plasma processing apparatus can determine an etching rate change time instant by deriving the change in the etching rate from the temporal change of the sum of the spectral differences.

In the invention, the determiner of the plasma processing apparatus can allocate the film thickness before the etching processing to the etching start time instant and the optical spectrum before the etching start time instant, allocate the film thickness after the etching processing to the optical spectrum at the etching end time instant, and allocate the film thickness by linear interpolation with respect to the etching time to the optical spectrum between the etching start time instant and the etching end time instant.

In the invention, the optical spectrum data of the plasma processing apparatus can be subjected to predetermined signal processing in the wavelength direction after being detected by the light receiver.

Note that the embodiment described above is merely an example of an embodiment of the invention, and the embodiment of the invention is not limited to the above.

Although the invention made by the inventors has been described in detail based on the embodiment, the invention is not limited to the above embodiment, and it goes without saying that various modifications can be made without departing from the gist of the invention. For example, the above embodiment has been described in detail to facilitate understanding of the description of the invention, and the invention is not required to include all the configurations described above. Further, a part of the configuration of one embodiment can be replaced with a configuration of another embodiment, and the configuration of one embodiment can be added to a configuration of another embodiment. Further, it is possible to add, delete, and replace another configuration for a part of the configuration of each embodiment.

REFERENCE SIGNS LIST 10 plasma processing apparatus
11 vacuum container
12 plasma
13 sample stage
14 wafer
15 interference light
16 light receiver
17 detection unit
19 processing chamber
20 signal processor
21 film thickness and depth determiner (determiner)
22 display
23 controller
30 database unit
31 comparator
60 light amount variation corrector
61 first digital filter
62 differentiator
63 second digital filter

The invention claimed is:

1. A plasma processing method comprising:
arranging a wafer having a layer to be processed on a surface thereof in a processing chamber inside a vacuum container:
forming plasma in the processing chamber and etching a film formed in advance on a surface of the wafer;
receiving interference light reflected on the surface of the wafer at a plurality of time instants from when the plasma is formed to when the etching is completed;
determining an etching start time instant of the wafer based on data indicating amounts of change per a time period between two of the plurality of time instants in signals, the signals indicating an intensity of the interference light corresponding to each of the plurality of time instants after the plasma is formed and the layer to be processed is exposed to the plasma;
detecting a film thickness or determining reaching an end point of the processing of the wafer using a signal indicating the intensity of the interference light obtained at the plurality of time instants after the determined etching start time; and
controlling the etching of the wafer in accordance with the determined etching start time and the detected film thickness or the determined end point of the processing,
wherein the signal indicating the intensity of the interference light includes a spectral waveform, and the etching start time instant is determined by calculating differences between the spectral waveforms at the two of the plurality time instants, and a time instant when a sum of the differences per the time period between the two of the plurality time instants becomes equal to or more than a predetermined threshold value is determined as the etching start time instant.

2. The plasma processing method according to claim 1, wherein differences between the spectral waveforms at adjacent time instants are calculated, and the etching start time instant is determined based on an average value of change rates of a sum of the differences with respect to time.

3. The plasma processing method according to claim 1, wherein when differences between spectral waveforms at adjacent time instants are calculated, and a change rate of a sum of the differences with respect to time is approximated with a curve, a first inflection point and a second inflection point exist sequentially in time series on the curve, a time instant of the first inflection point is determined as the etching start time instant, a time from the first inflection point to the second inflection point is set as a first processing section, and a time after the second inflection point is set as a second processing section having a higher etching rate than an etching rate of the first processing section.

4. The plasma processing method according to claim 1, wherein the film thickness is assumed to be constant until the etching start time instant that has been determined.

5. A plasma processing apparatus that arranges a wafer having a layer to be processed on a surface thereof in a processing chamber inside a vacuum container, forms plasma in the processing chamber, and etches a film formed in advance on a surface of the wafer, the plasma processing apparatus comprising:
a detector configured to receive interference light reflected on the surface of the wafer and generate a signal indicating intensity of the interference light at a plurality of time instants from when the plasma is formed to when the etching is completed; and
a determiner configured to determine an etching start time instant based on data indicating amounts of change per a time period between two of the plurality of time instants in signals, the signals indicating the intensities of the interference light corresponding to each of the plurality of time instants after the plasma is formed and the layer to be processed is exposed to the plasma, and to detect a film thickness or determine reaching an end point of the processing of the wafer using the signal indicating the intensity of the interference light obtained at the plurality of time instants after the determined etching start time, wherein the signal indicating the intensity of the interference light includes a spectral waveform, and the determiner is configured to calculate differences between the spectral waveforms at the two of the plurality time instants, and determine as the etching start time instant a time instant when a sum of the differences per the time period between the two of the plurality time instants becomes equal to or more than a predetermined threshold value.

6. The plasma processing apparatus according to claim 5, wherein the determiner calculates differences between the spectral waveforms at adjacent time instants and determines the etching start time instant based on an average value of change rates with respect to time in a sum of the differences.

7. The plasma processing apparatus according to claim 5, wherein the determiner assumes that a thickness of the film is constant until the etching start time instant that has been determined.

* * * * *